United States Patent
Lee et al.

(10) Patent No.: US 10,879,311 B2
(45) Date of Patent: Dec. 29, 2020

(54) VERTICAL TRANSPORT FIN FIELD EFFECT TRANSISTORS COMBINED WITH RESISTIVE MEMORY STRUCTURES

(71) Applicant: INTERNATIONAL BUSINESS MACHINES CORPORATION, Armonk, NY (US)

(72) Inventors: Choonghyun Lee, Rensselaer, NY (US); Takashi Ando, Tuckahoe, NY (US); Alexander Reznicek, Troy, NY (US); Jingyun Zhang, Albany, NY (US); Pouya Hashemi, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/271,501

(22) Filed: Feb. 8, 2019

(65) Prior Publication Data
US 2020/0258941 A1    Aug. 13, 2020

(51) Int. Cl.
*H01L 27/24*    (2006.01)
*H01L 45/00*    (2006.01)
(Continued)

(52) U.S. Cl.
CPC ...... *H01L 27/2454* (2013.01); *H01L 27/2463* (2013.01); *H01L 29/66666* (2013.01);
(Continued)

(58) Field of Classification Search
CPC ............. H01L 27/2454; H01L 27/2463; H01L 29/66666; H01L 29/7827; H01L 45/08;
(Continued)

(56) References Cited

U.S. PATENT DOCUMENTS 9,478,741 B2    10/2016  Hsu
9,825,223 B2    11/2017  Toh et al.
(Continued)

FOREIGN PATENT DOCUMENTS

WO    2007066276 A2    6/2007

OTHER PUBLICATIONS

Burr et al., "Experimental Demonstration and Tolerancing of a Large-Scale Neural Network (165 000 Synapses) Using Phase-Change Memory as the Synaptic Weight Element", IEEE Transactions on Electron Devices. vol. 62. No. 11. Nov. 2015. pp. 3498-3507.

(Continued)

*Primary Examiner* — Christine A Enad
(74) *Attorney, Agent, or Firm* — Tutunjian & Bitetto, P.C.; L. Jeffrey Kelly

(57) ABSTRACT

A resistive memory structure is provided. The resistive memory structure includes a vertical fin on a substrate, wherein the sidewalls of the vertical fin each have a {100} crystal face. The resistive memory structure further includes a fin template on the vertical fin, and a gate structure on the vertical fin. The resistive memory structure further includes a top source/drain on opposite sidewalls of the vertical fin, and a bottom electrode layer on the top source/drain, wherein the bottom electrode layer is on opposite sides of the fin template. The resistive memory structure further includes a first middle resistive layer on a portion of the bottom electrode layer, a top electrode layer on the first middle resistive layer, and a first electrical contact on a portion of the bottom electrode layer.

20 Claims, 12 Drawing Sheets

(51) Int. Cl.
H01L 29/66 (2006.01)
H01L 29/78 (2006.01)
(52) U.S. Cl.
CPC .......... *H01L 29/7827* (2013.01); *H01L 45/08* (2013.01); *H01L 45/1233* (2013.01); *H01L 45/1253* (2013.01); *H01L 45/146* (2013.01); *H01L 45/1608* (2013.01)
(58) Field of Classification Search
CPC ............. H01L 45/1233; H01L 45/1253; H01L 45/146; H01L 45/1608
See application file for complete search history.

(56) References Cited

U.S. PATENT DOCUMENTS

| | | | |
|---|---|---|---|
| 10,027,326 B2 | 7/2018 | Bai et al. | |
| 10,269,869 B1* | 4/2019 | Ando | H01L 29/4966 |
| 2013/0326116 A1* | 12/2013 | Goss | G06F 12/0871 |
| | | | 711/103 |
| 2015/0262663 A1 | 9/2015 | Lee et al. | |
| 2017/0236869 A1* | 8/2017 | Tran | H01L 27/2472 |
| | | | 257/4 |
| 2017/0330958 A1 | 11/2017 | Coquand et al. | |
| 2018/0033963 A1 | 2/2018 | Toh et al. | |
| 2018/0158928 A1 | 6/2018 | Chen et al. | |
| 2020/0052037 A1* | 2/2020 | Kong | H01L 45/1253 |

OTHER PUBLICATIONS

Peter Clarke, "Report: TSMC to offer embedded ReRAM in 2019", EETE Analog. http://www.eenewsanalog.com/news/report-tsmc-offer-embedded-reram-2019. Jun. 8, 2017. pp. 1-2.

Gokmen et al., "Acceleration of Deep Neural Network Training with Resistive Cross-Point Devices: Design Considerations", Frontiers in Neuroscience. www.frontiersin.org. vol. 10. Article 333. Jul. 21, 2016. pp. 1-13.

Sheu et al., "A ReRAM Integrated 7T2R Non-volatile SRAM for Normally-off Computing Application", 2013 IEEE Asian Solid-State Circuits Conference. Nov. 11-13, 2013. pp. 245-248.

Dr. Rainer Waser, "Redox-based Tera-bit memories", Electronic Materials Research Laboratory. http://emrl.de/ra1.html. Nov. 14, 2018. pp. 1-11.

* cited by examiner

VERTICAL TRANSPORT FIN FIELD EFFECT TRANSISTORS COMBINED WITH RESISTIVE MEMORY STRUCTURES

BACKGROUND

The present invention generally relates to resistive memory structures, and more particularly to vertical transport fin field effect transistors combined with resistive random access memory.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a resistive memory structure is provided. The resistive memory structure includes a vertical fin on a substrate, wherein the sidewalls of the vertical fin each have a {100} crystal face. The resistive memory structure further includes a fin template on the vertical fin, and a gate structure on the vertical fin. The resistive memory structure further includes a top source/drain on opposite sidewalls of the vertical fin, and a bottom electrode layer on the top source/drain, wherein the bottom electrode layer is on opposite sides of the fin template. The resistive memory structure further includes a first middle resistive layer on a portion of the bottom electrode layer, a top electrode layer on the first middle resistive layer, and a first electrical contact on a portion of the bottom electrode layer.

In accordance with another embodiment of the present invention, a crossbar array is provided. The crossbar array includes a plurality of resistive memory structures each including a vertical transport fin field effect transistor, two resistive memory elements electrically coupled to a top source/drain of the vertical transport fin field effect transistor, and two electrical contacts formed to a bottom electrode layer of each of the two resistive memory elements. The crossbar array further includes a first metal line electrically connected to a first of the two electrical contacts on each of the plurality of resistive memory structures in a row of the crossbar array, and a second metal line electrically connected to a first of the two resistive memory elements on each of the plurality of resistive memory structures in a column of the crossbar array.

In accordance with yet another embodiment of the present invention, a method of forming a resistive memory structure is provided. The method includes forming a vertical fin on a substrate and a fin template on the vertical fin, wherein the sidewalls of the vertical fin each have a {100} crystal face. The method further includes forming a gate structure on the vertical fin, and forming a top source/drain on opposite sidewalls of the vertical fin. The method further includes forming a bottom electrode layer on the top source/drain, wherein the bottom electrode layer is on opposite sides of the fin template. The method further includes forming a first middle resistive layer on a portion of the bottom electrode layer. The method further includes forming a top electrode layer on the first middle resistive layer, and forming a first electrical contact on a portion of the bottom electrode layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
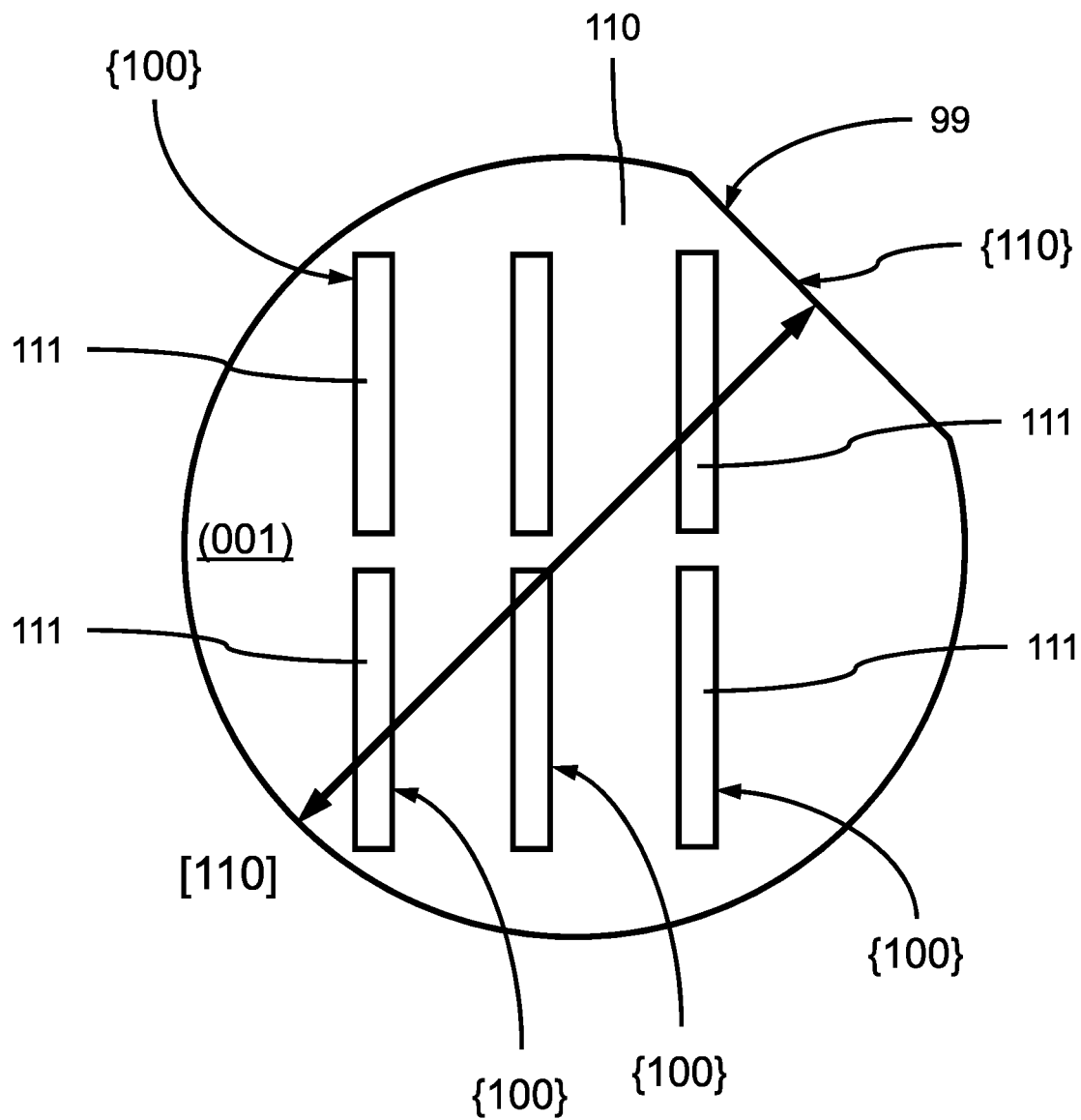
FIG. 1 is a top view of a plurality of vertical fins on a substrate, where the vertical fins are at a 45 degree angle to the [110] crystal direction, in accordance with an embodiment of the present invention.

Embodiments of the present invention provide a memory device implementing two resistive memory elements electrically coupled to a vertical transport fin field effect transistor (VT FinFET), where the resistive memory elements are electrically coupled to the top source/drain of the VT FinFET. In this manner two ReRAM cells can be integrated in parallel with the same FinFET to provide separate paths to sense the states of the two ReRAM cells. Separate electrical paths can be used to sense the states of two ReRAM cells and the difference can be determined using a periphery circuit. The two ReRAM cells can represent differential weights for Neuromorphic Computing without an area penalty.

Embodiments of the present invention provide vertical transport fin field effect transistor devices with a hardmask fin template separating two ReRAM cells, so the two ReRAM cells are each self-aligned with the vertical fin and top source/drain.

Embodiments of the present invention provide a method of fabricating a vertical transport fin field effect transistor having vertical fins with fin sidewalls with a {100} crystal face, where the {100} fin sidewalls can provide a growth surface for the lateral epitaxial growth of the top source/drains. In various embodiments, the vertical fins can be at a 45 degree angle to the primary flat (e.g., (011) surface) of a wafer substrate to form fin sidewalls with a {100} crystal face. The {100} notation denotes the crystal planes that are equivalent to the (100) plane by the symmetry of the crystal.

Embodiments of the present invention provide memristors for neuromorphic computing as well as high-density and high-speed non-volatile memory application. A resistive memory device can be used as a connection (synapse) between a pre-neuron and post-neuron, representing the connection weight in the form of device resistance. In various embodiments, multiple pre-neurons and post-neurons can be connected through a crossbar array of ReRAMs, which can naturally expresses a fully-connected neural network.

Embodiments of the present invention provide a method and structure for integrating two ReRAM cells with one vertical FET. One FinFET transistor (1T) has two ReRAM cells (2R) (1T2R) connected in parallel to represent differential weights for Neuromorphic Computing without an area penalty. Two unipolar ReRAM cells with linear switching for differential weights can require more devices and periphery circuits to represent one weight, which can impose an area penalty compared to the memory device implementing two resistive memory elements electrically coupled directly to a top source/drain of a vertical transport fin field effect transistor (VT FinFET).

Exemplary applications/uses to which the present invention can be applied include, but are not limited to: Deep Neural Network (DNN), neuromorphic computing, and high-density and high-speed non-volatile memory application.

It is to be understood that aspects of the present invention will be described in terms of a given illustrative architecture; however, other architectures, structures, substrate materials and process features and steps can be varied within the scope of aspects of the present invention.

Referring now to the drawings in which like numerals represent the same or similar elements and initially to FIG. 1, a top view of a plurality of vertical fins on a substrate, where the vertical fins are at a 45 degree angle to the [110] crystal direction, in accordance with an embodiment of the present invention.

In one or more embodiments, the vertical fin(s) 111 of a vertical transport fin field effect transistor can be formed on a substrate 110, where the substrate can be a crystalline semiconductor having a predefined orientation of the crystal faces. The top surface of the substrate 110 can be a (001) crystal face (i.e., normal to the z-direction). In various embodiments, the vertical fin(s) 111 can be aligned with the crystal planes of the semiconductor substrate, such that the sidewalls surfaces of the vertical fin(s) 111 can be an exposed {100} crystal plane. To achieve an exposed {100} crystal plane, the vertical fin(s) 111 can be at a 45 degree angle to the [110] direction. In various embodiments, the vertical fin(s) can be formed at a 45 degree angle to a primary flat 99 of a semiconductor wafer having a {110} crystal face, where the wafer formed the substrate 110.

In various embodiments, the substrate 110 can be a semiconductor substrate, where the semiconductor can be a type IV semiconductor (e.g., silicon (Si), germanium (Ge)), a IV-IV semiconductor (e.g., silicon-germanium (SiGe), silicon carbide (SiC), a III-V semiconductor (e.g., gallium arsenide (GaAs), indium phosphide (InP), indium-gallium arsenide (InGaAs), etc.), where the crystal structure can allow lateral epitaxial growth on a crystalline surface. In various embodiments, the substrate 110 can be a semiconductor-on-insulator substrate (SeOI).

In various embodiments, the vertical fins 111 can be arranged on the surface of the substrate 110 in rows and/or columns. The vertical fins 111 can form a square or rectangular array on the substrate 110, where the array can be an X×Y array, where X and Y can be the same or different values. The shape of the array can depend on the number, length, and pitch of the fins 111.

Figure 2:
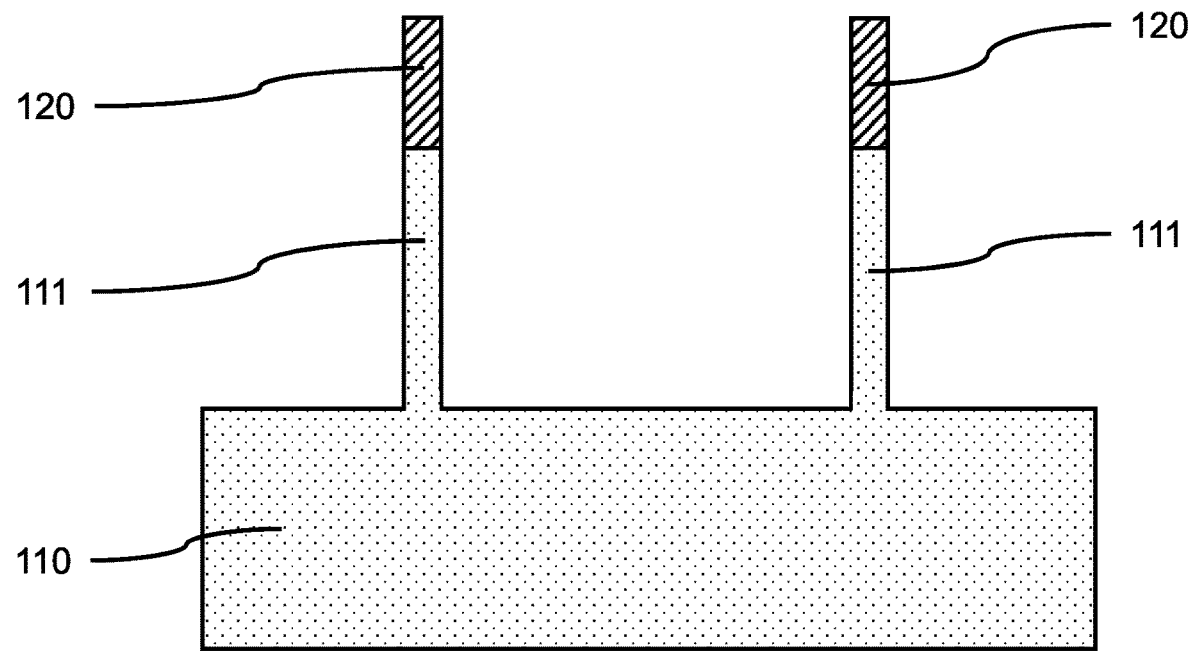
FIG. 2 is a cross-sectional side view showing a plurality of vertical fins on a substrate with a fin template on each of the vertical fins, in accordance with an embodiment of the present invention.

FIG. 2 is a cross-sectional side view showing a plurality of vertical fins on a substrate with a fin template on each of the vertical fins, in accordance with an embodiment of the present invention.

In one or more embodiments, one or more vertical fins 111 can be formed on a substrate 110, where the vertical fins can be formed by epitaxial growth and/or directional etching, for example, by reactive ion etching (RIE). In various embodiments, the vertical fins can be formed by an image transfer process, for example, a sidewall image transfer (SIT), also referred to as Self-Aligned Double Patterning (SADP), a Self-aligned triple patterning (SATP) process, a Self-Aligned Quadruple Patterning (SAQP) process, or a combination thereof. In various embodiments, the vertical fins can be formed by a direct-write process, for example, using extreme ultraviolet (EUV) lithography, electron beam lithography, or x-ray lithography.

In one or more embodiments, fin templates 120 can be formed on the vertical fins 111, where a fin template 120 can be formed on each of the vertical fins 111 from a fin template layer as part of the patterning process. In various embodiments, the fin templates 120 can be a hardmask, for example, silicon oxide (SiO), silicon nitride (SiN), silicon oxynitride (SiON), silicon boronitride (SiBN), or a combination therefore.

In one or more embodiments, the vertical fins 111 can have a width in a range of about 5 nanometers (nm) to about 10 nm, or about 6 nm to about 8 nm, although other widths are also contemplated.

Figure 3:
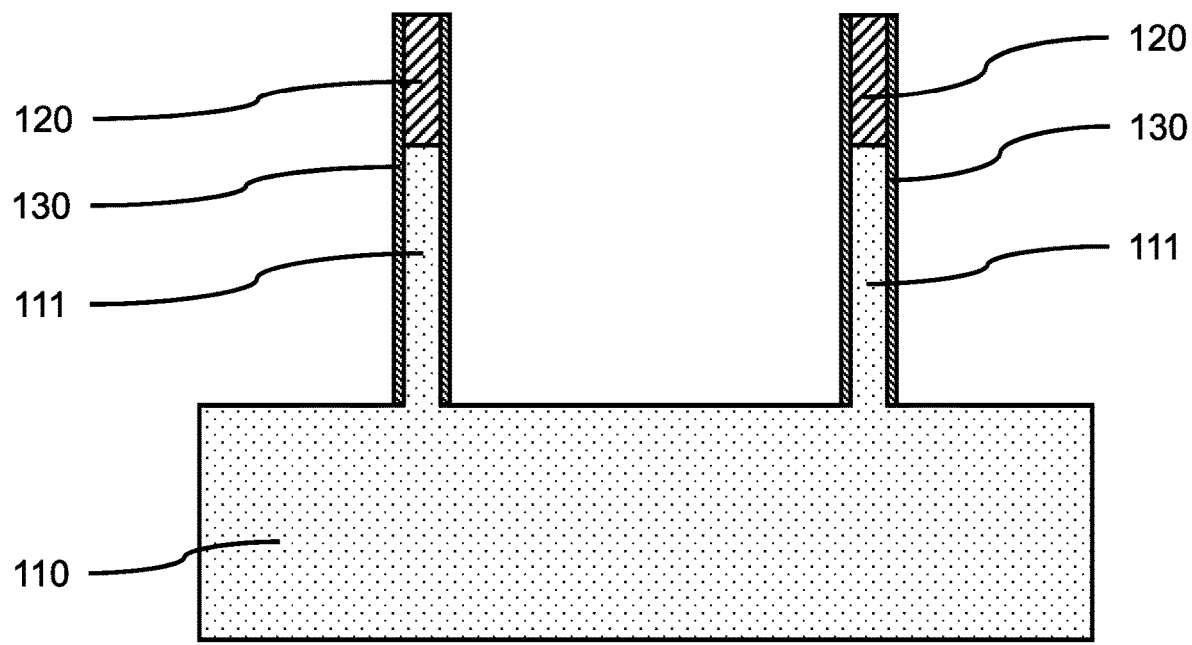
FIG. 3 is a cross-sectional side view showing a fin liner on each of the plurality of vertical fins and fin templates, in accordance with an embodiment of the present invention.

FIG. 3 is a cross-sectional side view showing a fin liner on each of the plurality of vertical fins and fin templates, in accordance with an embodiment of the present invention.

In one or more embodiments, a fin liner 130 can be formed on each of the vertical fins 111 and fin templates, where the fin liner can be formed by a conformal deposition, for example, atomic layer deposition (ALD), plasma enhanced ALD (PEALD), low pressure chemical vapor deposition (LPCVD), or a combination thereof. In various embodiments, a directional etch (e.g., RIE) can be used to remove portions of the fin liner 130 from surfaces of the fin templates 120 and substrate 110 approximately perpendicular to the etching beam, while portions of the fin liner 130 remain on the sidewalls of the vertical fins 111 and fin templates 120.

In various embodiments, the fin liner 130 can be a hardmask material different from the fin templates 120 to allow selective removal of the fin liner. In various embodiments, the fin line 130 can be, for example, silicon oxide (SiO), silicon nitride (SiN), silicon oxynitride (SiON), silicon boronitride (SiBN), or combinations therefore. The fin liner 130 can have a thickness in a range of about 2 nm to about 6 nm, or about 3 nm to about 5 nm, although other thicknesses are contemplated.

Figure 4:
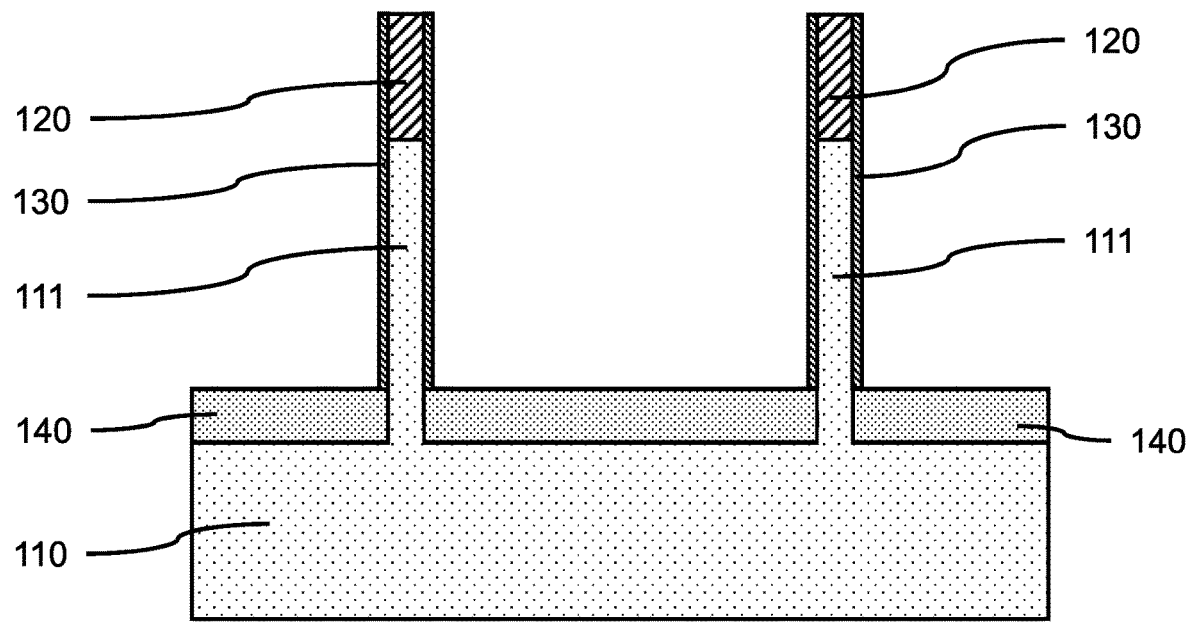
FIG. 4 is a cross-sectional side view showing the substrate recessed below the fin liner, and a bottom source/drain layer formed on the recessed substrate, in accordance with an embodiment of the present invention.

FIG. 4 is a cross-sectional side view showing the substrate recessed below the fin liner, and a bottom source/drain layer formed on the recessed substrate, in accordance with an embodiment of the present invention.

In one or more embodiments, the portion of the substrate 110 exposed around the vertical fins 111 can be recessed using a directional etch (e.g., RIE). A portion of the substrate 110 can be removed to a predetermined depth to extend the vertical fins 111 below the fin liner 130, where a portion of the vertical fins are exposed. In various embodiments, the substrate can be recessed to a depth in a range of about 10 nm to about 40 nm, or about 20 nm to about 30 nm, although other depth are also contemplated.

In one or more embodiments, a bottom source/drain layer 140 can be formed on the surface of the recessed substrate 110, where the bottom source/drain layer 140 can be formed by epitaxial growth on the exposed substrate surface and/or sidewalls of the vertical fins 111 through lateral growth. In various embodiments, the bottom source/drain layer 140 can be semiconductor material doped with an n-type dopant (e.g., phosphorus (P), arsenic (As), etc.) or a p-type dopant (e.g., boron (B), gallium (Ga), etc.). In a non-limiting exemplary embodiment, the bottom source/drain layer 140 can be phosphorus-doped silicon (Si:P) to form an n-type FinFET or a boron-doped silicon germanium (SiGe:B) to form a p-type FinFET.

In various embodiments, the bottom source/drain layer 140 can be formed to a thickness in a range of about 10 nm to about 40 nm, or about 20 nm to about 30 nm, although other thicknesses are also contemplated. The bottom source/drain layer 140 can be formed to a thickness that covers the sidewall of the vertical fin(s) 111 between the substrate surface and the bottom edge of the fin liner 130.

Figure 5:
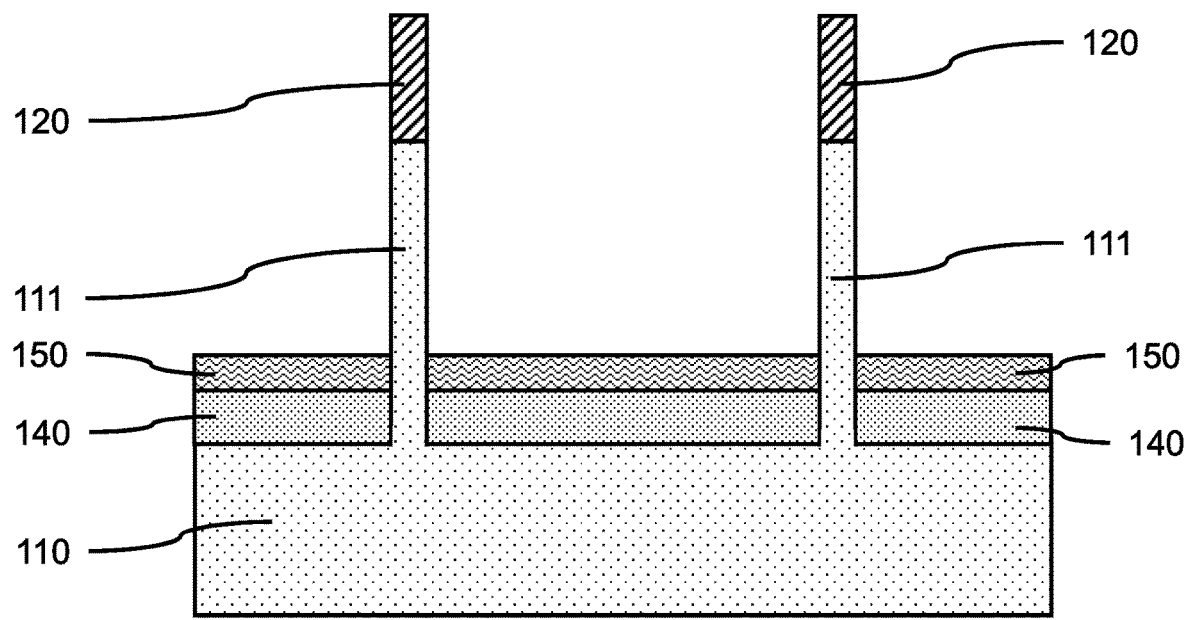
FIG. 5 is a cross-sectional side view showing the fin liner removed and a bottom spacer layer formed on the bottom source/drain layer, in accordance with an embodiment of the present invention.

FIG. 5 is a cross-sectional side view showing the fin liner removed and a bottom spacer layer formed on the bottom source/drain layer, in accordance with an embodiment of the present invention.

In one or more embodiments, the remaining portions of the fin liner 130 can be removed to expose the sidewalls of the vertical fins 111 above the source/drain layer and the fin templates 120. The fin liner 130 can be removed using a selective, isotropic etch, for example, a wet chemical etch or a dry plasma etch before forming a bottom spacer layer 150 adjacent to the vertical fin(s) 111.

In one or more embodiments, a bottom spacer layer 150 can be formed on the exposed top surface of the bottom source/drain layer 140, where the bottom spacer layer 150 can be formed by a directional deposition, for example, a high density plasma (HDP) or gas cluster ion beam (GCIB). In various embodiments, the bottom spacer layer 150 can be formed to a thickness in a range of about 4 nm to about 10 nm, or about 5 nm to about 7 nm, although other thicknesses are also contemplated. The bottom spacer layer 150 can cover a lower portion of the vertical fins 111. An isotropic etch can be used to remove deposited material of the bottom spacer layer from the sidewalls of the vertical fins 111.

In one or more embodiments, the bottom spacer layer 150 can be a dielectric material, including, but not limited to, silicon nitride (SiN), silicon oxynitride (SiON), silicon carbo-oxynitride (SiCON), and combinations thereof.

Figure 6:
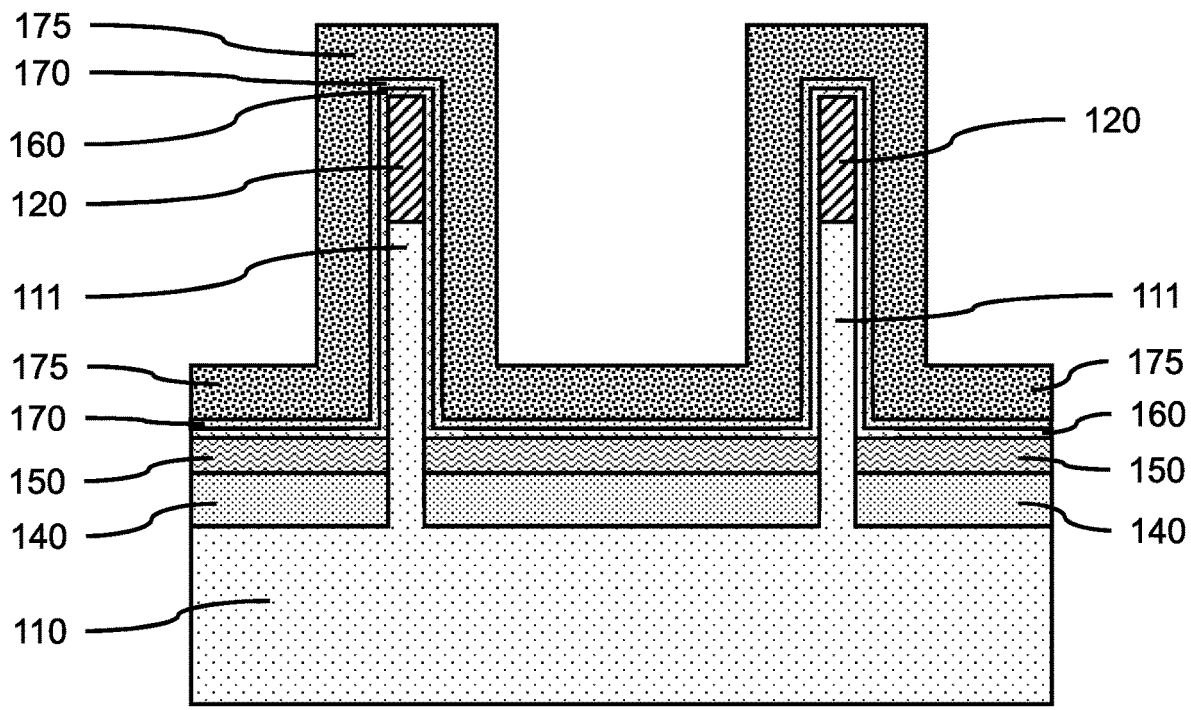
FIG. 6 is a cross-sectional side view showing a gate dielectric layer formed on the exposed surfaces of the bottom spacer layer, plurality of vertical fins, and fin templates, and a gate electrode formed on the gate dielectric layer, in accordance with an embodiment of the present invention.

FIG. 6 is a cross-sectional side view showing a gate dielectric layer formed on the exposed surfaces of the bottom spacer layer, plurality of vertical fins, and fin templates, and a gate electrode formed on the gate dielectric layer, in accordance with an embodiment of the present invention.

In one or more embodiments, a gate dielectric layer 160 can be formed on the exposed surfaces of the bottom spacer layer 150, plurality of vertical fins 111, and fin templates 120, where the gate dielectric layer 160 can be formed by a conformal deposition, for example, ALD, PEALD, or a combination thereof. In various embodiments, the gate dielectric layer 160 can be formed to a thickness in a range of about 1 nm to about 5 nm, or about 2 nm to about 4 nm, although other thicknesses are also contemplated. In various embodiments, the gate dielectric layer can cover the end walls of the vertical fin(s) 111 to provide a gate-all-around structure.

The gate dielectric layer 160 can be silicon oxide (SiO), silicon nitride (SiN), a high-K dielectric material, or a combination thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In one or more embodiments, a gate electrode can be formed on the gate dielectric layer 160. In various embodiments, the gate electrode can be two or more layers, where the gate electrode can include a conductive gate layer 175 and/or a work function material layer 170. The work function material layer 170 can be formed on the gate dielectric layer 160 by a conformal deposition (e.g., ALD, PEALD). The conductive gate layer can be formed on the work function material layer by a conformal deposition (e.g., ALD, PEALD). In various embodiments, multiple work function material layers 170 can be formed on the gate dielectric layer 160.

In various embodiments, each of the work function material layers 170 can be a conducting metallic nitride or carbide compound material, for example, tantalum nitride (TaN), titanium nitride (TiN), tantalum carbide (TaC), titanium carbide (TiC), titanium aluminum carbide (TiAlC), and combinations thereof. The work function material layers 170 can be the same or different work function materials.

In various embodiments, the conductive gate layer 175 can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. titanium aluminide (TiAl), zirconium aluminide (ZrAl)), tantalum carbide (TaC), tantalum magnesium carbide (TaMgC), or any suitable combination of these materials.

In various embodiments, the gate electrode can be formed to a thickness in a range of about 5 nm to about 20 nm, or about 6 nm to about 10 nm, although other thicknesses are also contemplated. In various embodiments, the work function material layers 170 can be formed to a thickness in a range of about 1 nm to about 5 nm, or about 2 nm to about 4 nm, although other thicknesses are also contemplated. The conductive gate layer 175 can fill in the difference between the gate electrode thickness and the work function material layer thickness. The gate dielectric layer 160 and gate electrode can form a gate structure on a central portion of the vertical fin 111, where the gate structure can surround the central portion of the vertical fin without being on a top surface of the vertical fin(s) 111 due to the fin template 120 covering the top surface of the vertical fin 111.

Figure 7:
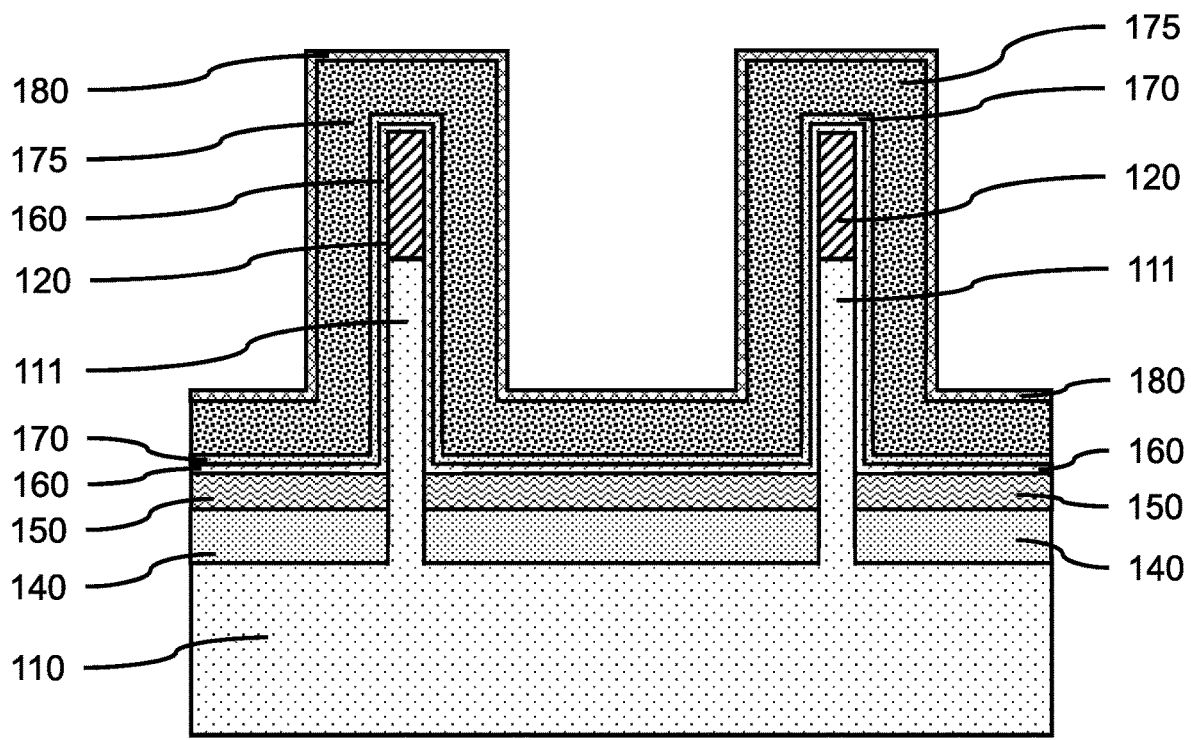
FIG. 7 is a cross-sectional side view showing an encapsulation layer formed on the surface of the gate electrode, in accordance with an embodiment of the present invention.

FIG. 7 is a cross-sectional side view showing an encapsulation layer formed on the surface of the gate electrode, in accordance with an embodiment of the present invention.

In one or more embodiments, an encapsulation layer 180 can be formed on the exposed surface of the gate electrode, including the conductive gate layer 175 and/or a work function material layer 170. The encapsulation layer 180 can be formed by a conformal deposition (e.g., ALD, PEALD). In various embodiments, the encapsulation layer 180 can be a dielectric material, including, but not limited to, silicon boro carbonitride (SiBCN), silicon nitride (SiN), silicon oxynitride (SiON), silicon carbo-oxynitride (SiCON), and combinations thereof.

Figure 8:
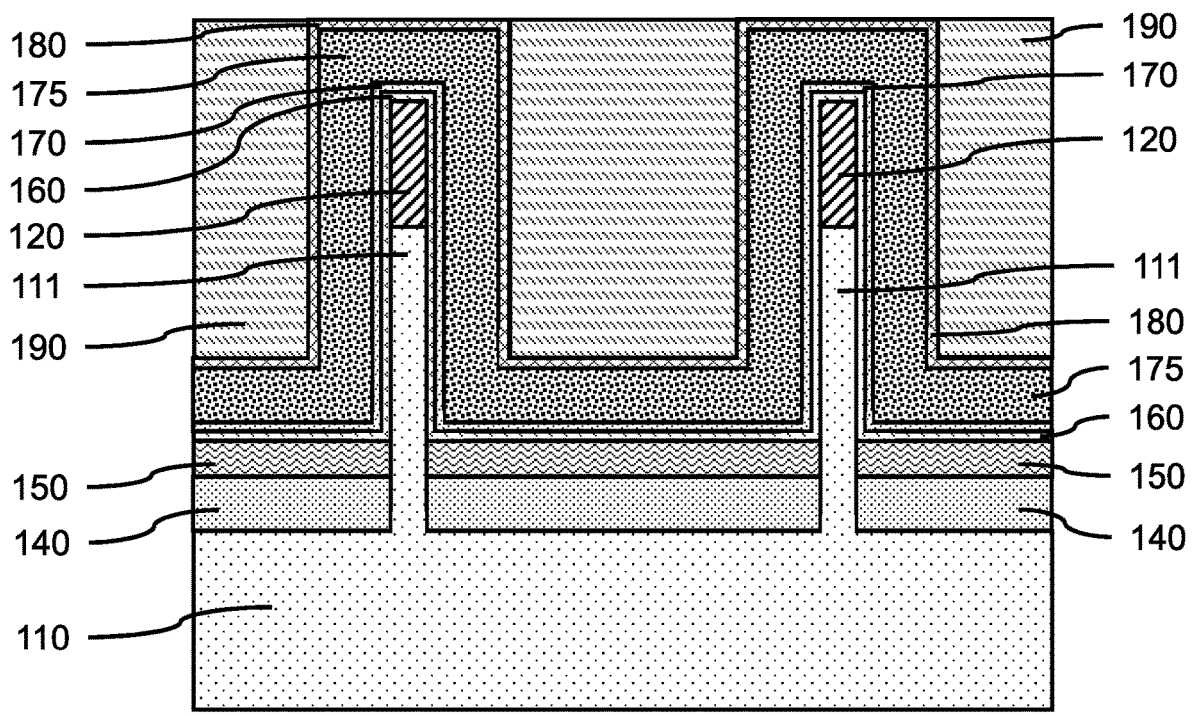
FIG. 8 is a cross-sectional side view showing a fill layer formed on the encapsulation layer, in accordance with an embodiment of the present invention.

FIG. 8 is a cross-sectional side view showing a fill layer formed on the encapsulation layer, in accordance with an embodiment of the present invention.

In one or more embodiments, a fill layer 190 can be formed on the encapsulation layer 180, where the fill layer 190 can be formed by a blanket deposition, for example, chemical vapor deposition (CVD), plasma enhanced CVD (PECVD), spin-on, or combinations thereof. In various embodiments, the fill layer 190 can fill in the gaps between neighboring vertical fins 111 and cover the encapsulation layer 180 and gate electrode. A chemical-mechanical polishing (CMP) can be used to remove portions of the fill layer 190 to expose a top surface of the encapsulation layer 180 above the vertical fins 111 and fin templates 120.

In various embodiments, the fill layer 190 can be a dielectric material, including, but not limited to, silicon oxide (SiO), a low-K dielectric material, or a combination thereof. A low-k dielectric material can include, but not be limited to, carbon doped silicon oxide (SiO:C), fluorine doped silicon oxide (SiO:F), a polymeric material, for example, tetraethyl orthosilicate (TEOS), hydrogen silsesquioxane (HSQ) and methylsilsesquioxane (MSQ), and combinations thereof.

Figure 9:
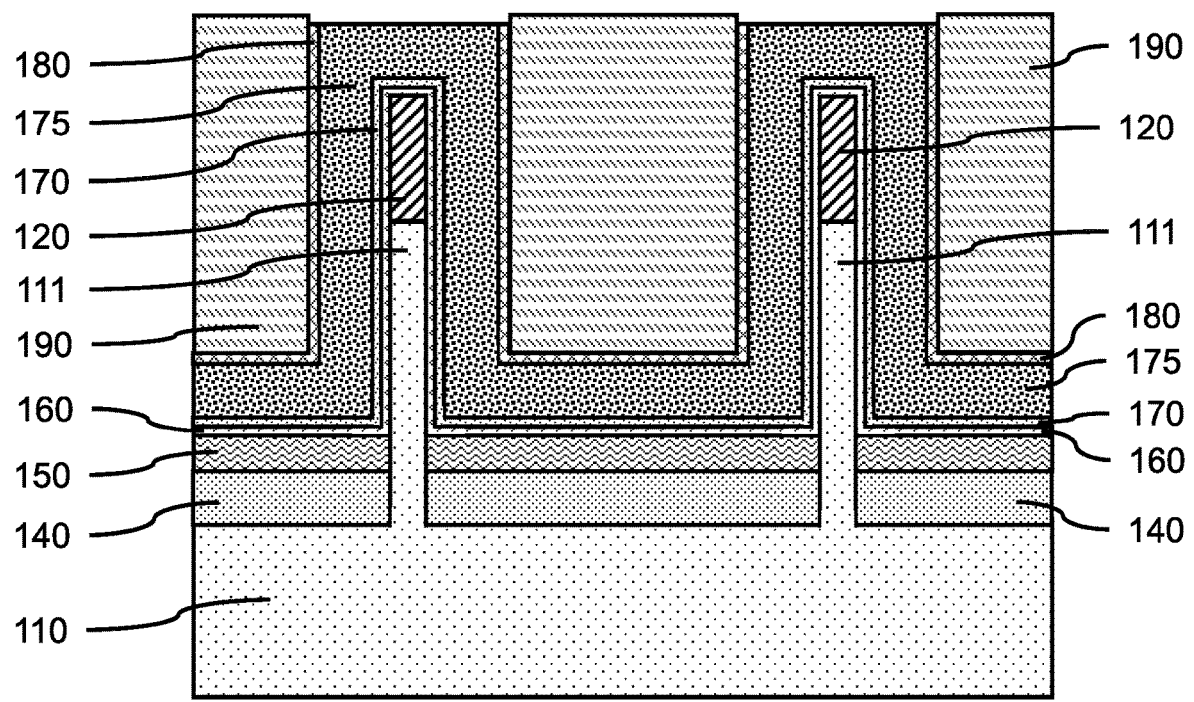
FIG. 9 is a cross-sectional side view showing a portion of the encapsulation layer removed from a top surface of the gate electrode, in accordance with an embodiment of the present invention.

FIG. 9 is a cross-sectional side view showing a portion of the encapsulation layer removed from a top surface of the gate electrode, in accordance with an embodiment of the present invention.

In one or more embodiments, a portion of the encapsulation layer 180 exposed by the CMP can be removed from a top surface of the gate electrode to form a shallow well within the surrounding fill layer 190. The portion of the encapsulation layer 180 can be removed using a selective isotropic or anisotropic etch. An upper edge of the encapsulation layer 180 can be exposed between an exposed sidewall of the fill layer 190 and the gate electrode.

Figure 10:
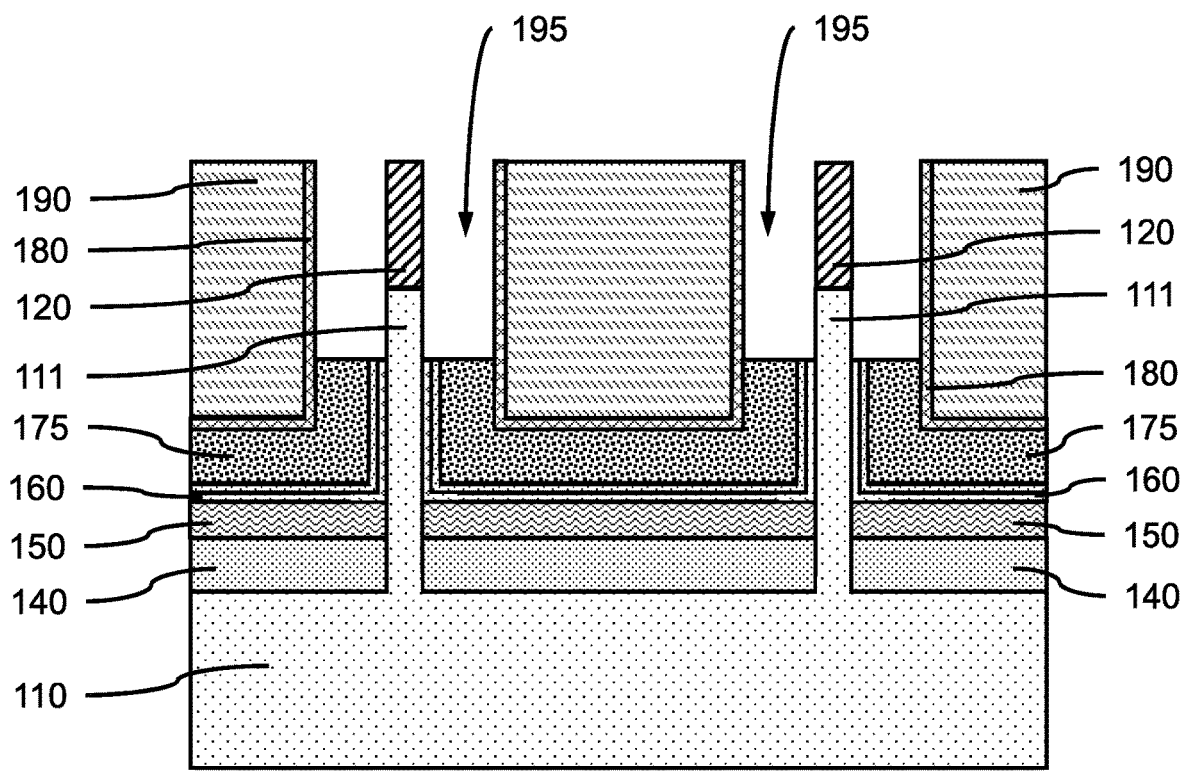
FIG. 10 is a cross-sectional side view showing a portion of the gate electrode and gate dielectric layer removed to expose the fin templates and an upper portion of the vertical fins, in accordance with an embodiment of the present invention.

FIG. 10 is a cross-sectional side view showing a portion of the gate electrode and gate dielectric layer removed to expose the fin templates and an upper portion of the vertical fins, in accordance with an embodiment of the present invention.

In one or more embodiments, an upper portion of the gate electrode can be removed to form a trench 195 surrounding the fin template(s) 120 and an upper portion of the vertical fin(s) 111. The upper portion of the gate electrode can be removed using a selective isotropic or anisotropic etch. Where the gate electrode includes a conductive gate layer 175 and/or a work function material layer 170 made of different materials, each of the work function material layer 170 and the conductive gate layer 175 can be removed using a separate selective isotropic or anisotropic etch. In various embodiments, a sufficient amount of the conductive gate layer 175 and/or work function material layer 170 can be removed to provide space for a subsequently formed top spacer and top source/drain. A portion of the encapsulation layer 180 can form an outer sidewall of a trench 195 and a portion of the gate dielectric layer 160 can form an inner sidewall (not shown) of the trench 195 after removal of the gate electrode.

In one or more embodiments, an upper portion of the gate dielectric layer 160 exposed by removing the gate electrode can be subsequently removed, where removal of the upper portion of the gate dielectric layer 160 can expose the fin template 120 and an upper portion of the vertical fin 111. In various embodiments, the upper portion of the gate dielectric layer 160 can be removed using a selective isotropic etch (e.g., wet chemical etch, dry plasma etch).

In various embodiments, the exposed upper portion of the vertical fin(s) 111 can have a height above the exposed surface of the conductive gate layer 175, work function material layer 170, and gate dielectric layer 160 in a range of about 10 nm to about 20 nm, or about 12 nm to about 16 nm, although other heights are also contemplated.

Figure 11:
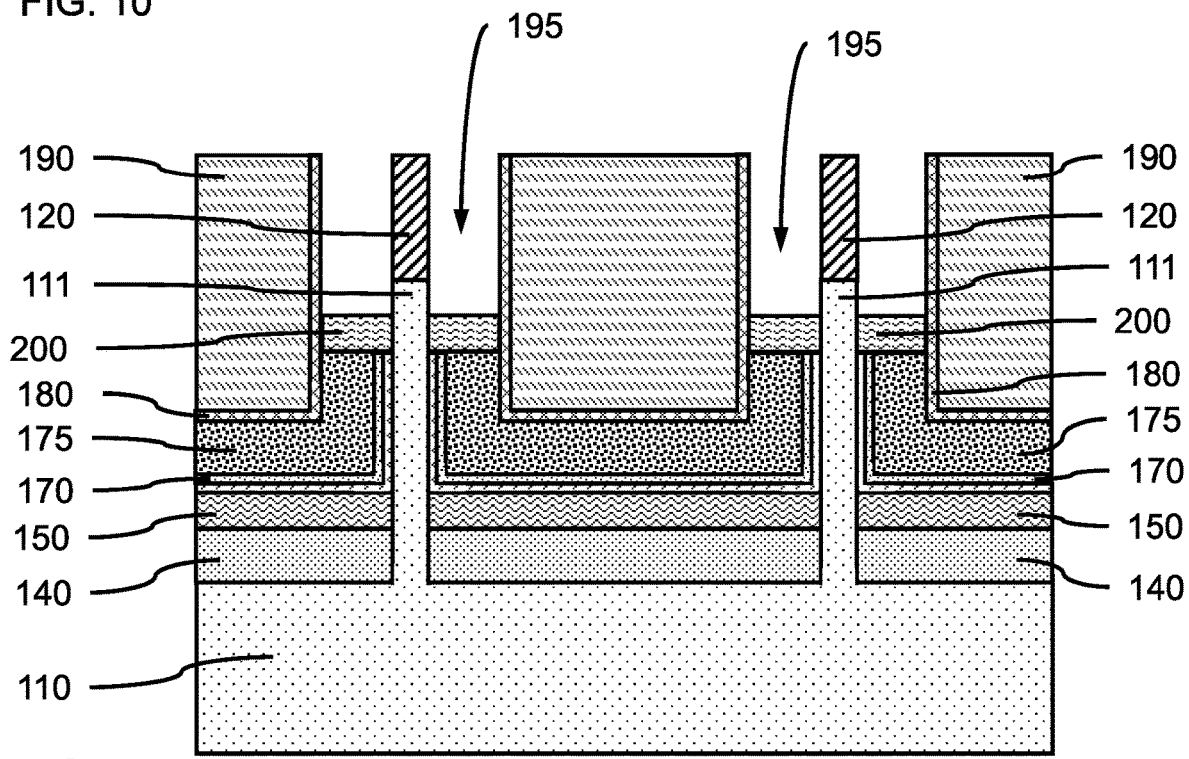
FIG. 11 is a cross-sectional side view showing a top spacer formed on a top surface of each of the gate electrodes and adjacent to the upper portion of the vertical fins, in accordance with an embodiment of the present invention.

FIG. 11 is a cross-sectional side view showing a top spacer formed on a top surface of each of the gate electrodes and adjacent to the upper portion of the vertical fins, in accordance with an embodiment of the present invention.

In one or more embodiments, a top spacer 200 can be formed on a top surface of each of the gate electrodes 170 and adjacent to the upper portion of the vertical fins 111, where the top spacer 200 can be formed by a directional deposition or a blanket deposition followed by an etch-back to the intended thickness. An isotropic etch can be used to remove material of the top spacer 200 from the sidewalls of the vertical fin(s) 111. A portion of the sidewalls of the vertical fin(s) 111 can remain exposed above the top surface of the top spacer(s) 200.

In various embodiments, the top spacer(s) 200 can be a dielectric insulating material, including, but not limited to, silicon nitride (SiN), silicon oxynitride (SiON), silicon carbo-oxynitride (SiCON), and combinations thereof.

In various embodiments, the top spacer 200 can have a thickness in a range of about 2 nm to about 15 nm, or about 3 nm to about 10 nm, or about 6 nm, although other heights are also contemplated. The thickness of the top spacer 200 can be less than the height of the exposed portion of the vertical fins 111, so a portion of the vertical fins remains exposed.

Figure 12:
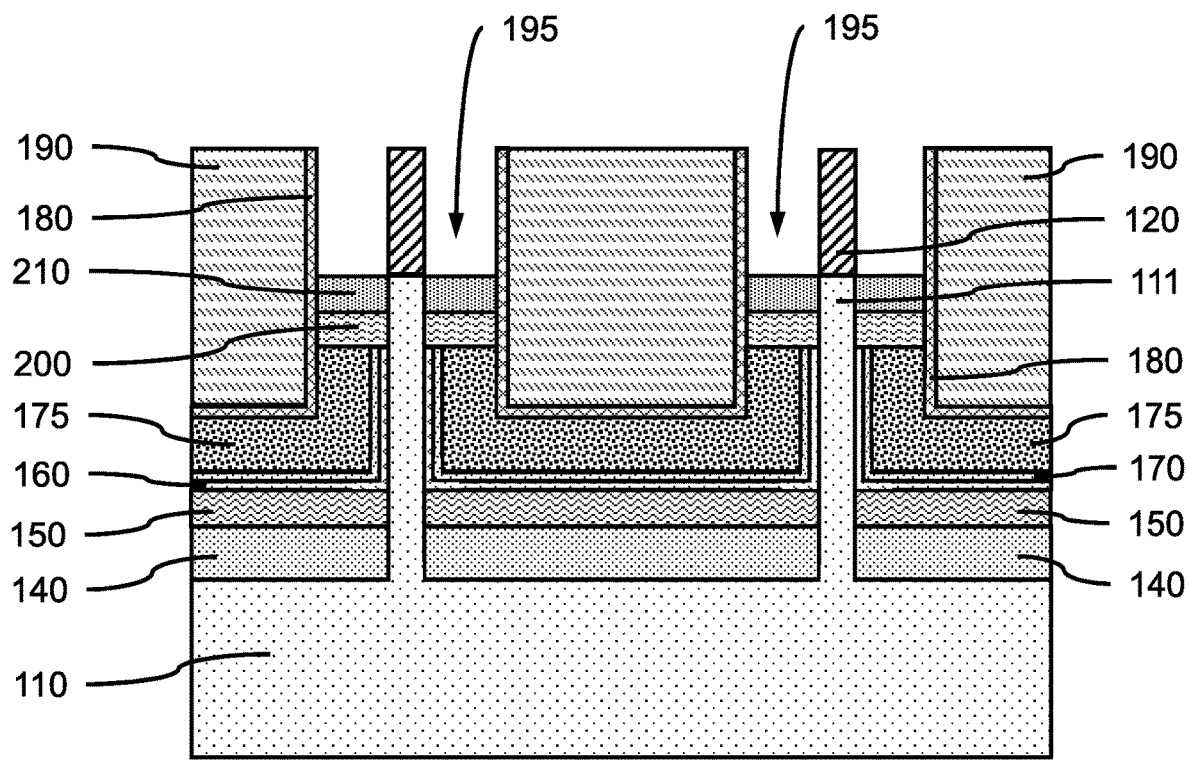
FIG. 12 is a cross-sectional side view showing a top source/drain formed on each of the top spacers and adjoining an upper portion of the vertical fins, in accordance with an embodiment of the present invention.

FIG. 12 is a cross-sectional side view showing a top source/drain formed on each of the top spacers and adjoining an upper portion of the vertical fins, in accordance with an embodiment of the present invention.

In one or more embodiments, a top source/drain 210 can be formed on each of the top spacers 200, where the top source/drain 210 adjoins the exposed sidewalls of the upper portion of the vertical fins 111. In various embodiments, the top source/drains 210 can be formed in the trench 195 on opposite sidewalls of the vertical fins 111 by a lateral epitaxial growth from the exposed sidewalls, where the sidewalls of the vertical fins can have (100) crystal faces. The top source/drains 210 can grow outward from the exposed sidewalls of the vertical fins 111 over the top surface of the top spacer 200. Epitaxial growth can have a greater growth rate on the (100) crystal faces of a crystalline vertical fin than on the (110) or (111) crystal faces, where the relationship between the epitaxial growth rates is (100)>(110)>(111). In various embodiments, the top source/drain(s) 210 can cover the entire exposed surface of the sidewalls of the vertical fins 111 without extending above the interface with the fin template(s) 120, and be in electrical connection with the adjoining vertical fin. The top surface of the top source/drain(s) 210 can be coplanar with the bottom surface of the fin template(s) 120. The top source/drain(s) 210 can be above the top spacer 200 and gated region formed by the gate dielectric layer 160, conductive gate layer 175, and/or work function material layer 170 on the sidewalls of the vertical fin(s) 111.

In various embodiments, the top source/drain(s) 210 can be semiconductor material doped with an n-type dopant (e.g., phosphorus (P), arsenic (As), etc.) or a p-type dopant (e.g., boron (B), gallium (Ga), etc.). In various embodiments, the top source/drain(s) 210 can be the same semiconductor material as the bottom source/drain layer 140, and may have the same dopant type as the bottom source/drain layer. In a non-limiting exemplary embodiment, the top source/drain(s) 210 can be phosphorus-doped silicon (Si:P) to form an n-type FinFET or a boron-doped silicon germanium (SiGe:B) to form a p-type FinFET.

In a non-limiting exemplary embodiment, the vertical fin(s) 111 can be single crystal silicon oriented on a single crystal silicon substrate 110 to have sidewalls with the (100) crystal face exposed. {100} fin sidewall surfaces for the vertical FinFETs can be achieved with a 45 degree rotation of (100) the substrate 110. In various embodiments, a type IV (e.g., Ge) or type IV-IV (e.g., SiGe) that have the same {100} crystal face effect can be used for the substrate 110 and to form the vertical fins 111 of the vertical FinFETs.

Figure 13:
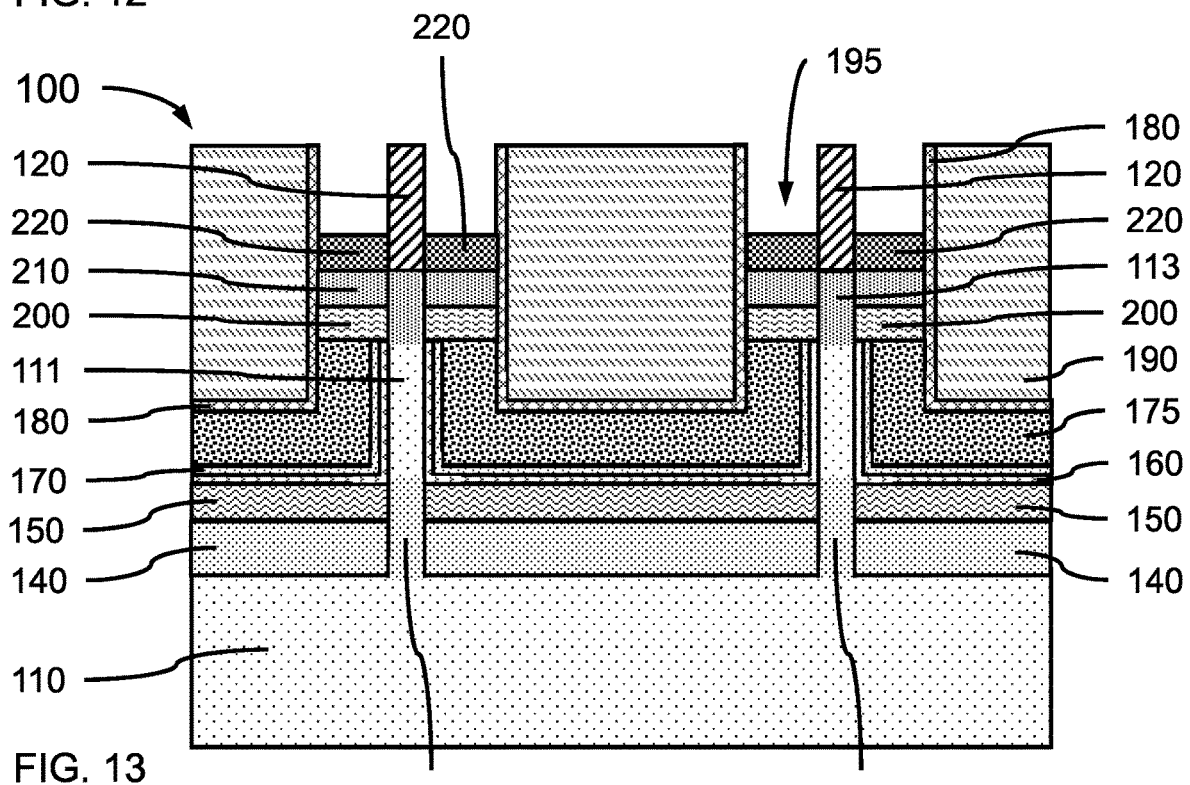
FIG. 13 is a cross-sectional side view showing a bottom electrode layer formed on each of the top source/drains and adjacent to the fin templates, in accordance with an embodiment of the present invention.

FIG. 13 is a cross-sectional side view showing a bottom electrode layer formed on each of the top source/drains and adjacent to the fin templates, in accordance with an embodiment of the present invention.

In one or more embodiments, the device structure 100 can be heat treated to diffuse dopant(s) from the top source/drain (s) 210 into an upper region of the vertical fin(s) 111 to form an upper extension region 113, and diffuse dopant(s) from the bottom source/drain layer 140 into a lower region of the vertical fin(s) 111 to form a lower extension region 112. The extension regions 112, 113 can extend beyond the top spacer 200 and bottom spacer layer 150, respectively, and into the gated region of the vertical fins 111.

In one or more embodiments, a bottom electrode layer 220 can be formed on each of the top source/drains 210, where the bottom electrode layer 220 is adjacent to and separated by the fin templates 120. The bottom electrode layer 220 can be formed by a blanket deposition (e.g., CVD, PECVD) and etched-back to a predetermined thickness using a selective etch. In various embodiments, the bottom electrode layer 220 can have a thickness in the range of about 5 nm to about 20 nm, or about 5 nm to about 10 nm, or about 8 nm to about 10 nm, although other thicknesses are also contemplated.

In various embodiments, the bottom electrode layer 220 can be a conductive material, including, but not be limited to, metals, for example, tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tantalum magnesium carbide TaMgC, tungsten silicide (WSi), tungsten nitride (WN), ruthenium oxide ($RuO_2$), cobalt silicide (CoSi), nickel silicide (NiSi)), transition metal aluminides (e.g. titanium aluminide ($Ti_3Al$), zirconium aluminide (ZrAl)), and any suitable combination of these materials.

Figure 14:
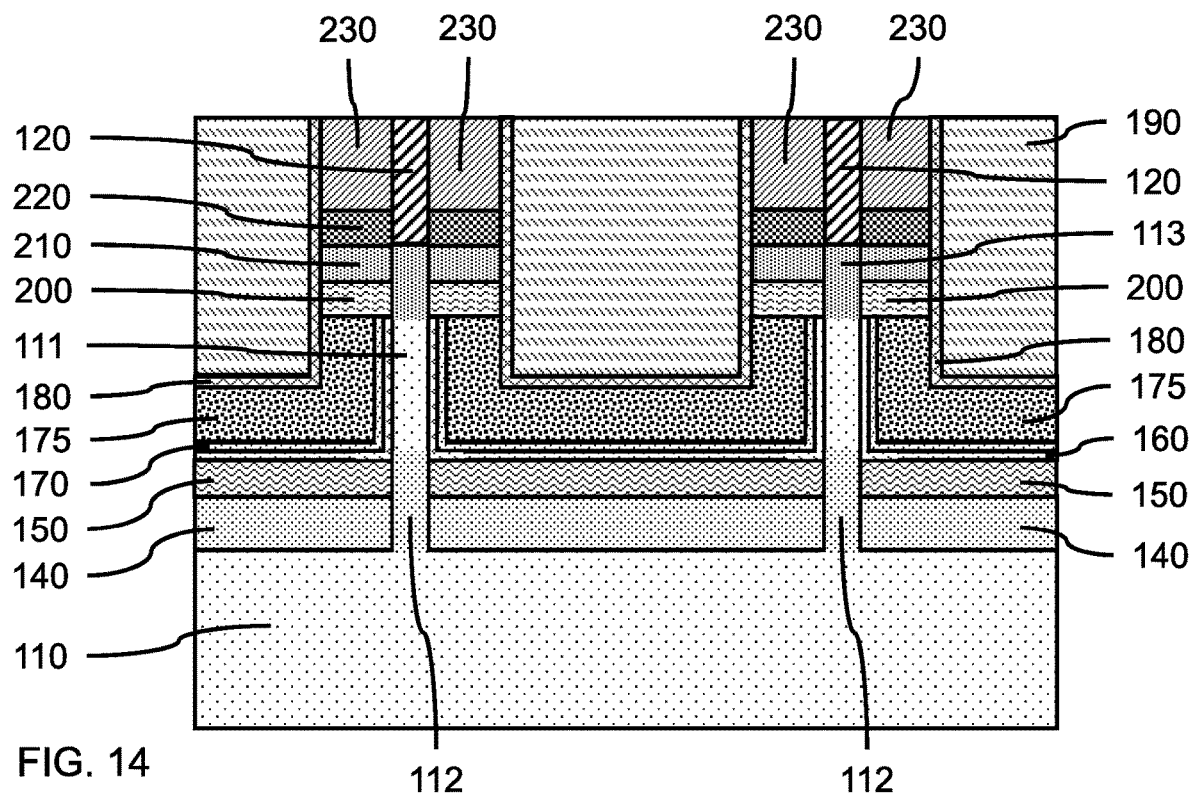
FIG. 14 is a cross-sectional side view showing a top plug layer formed on each of the bottom electrode layers, in accordance with an embodiment of the present invention.

FIG. 14 is a cross-sectional side view showing a top plug layer formed on each of the bottom electrode layers, in accordance with an embodiment of the present invention.

In one or more embodiments, a top plug layer 230 can be formed on each of the bottom electrode layers 220, where the top plug layer 230 can be formed by a blanket deposition that fills in the trench(es) 195. A CMP can be used to remove excess material of the top plug layer 230 to provide a smooth, flat surface, where the top surface of the top plug layer 230 is coplanar with the top surface of the fill layer 190.

In various embodiments, the top plug layer 230 can be a dielectric material, including, but not limited to, silicon boro carbonitride (SiBCN), silicon boronitride (SiBN), silicon oxynitride (SiON), silicon carbo-oxynitride (SiCON), and combinations thereof. The material of the top plug layer 230 can be different from the material of the fin template(s) 120 and encapsulation layer 180 to allow selective removal of the materials.

Figure 15:
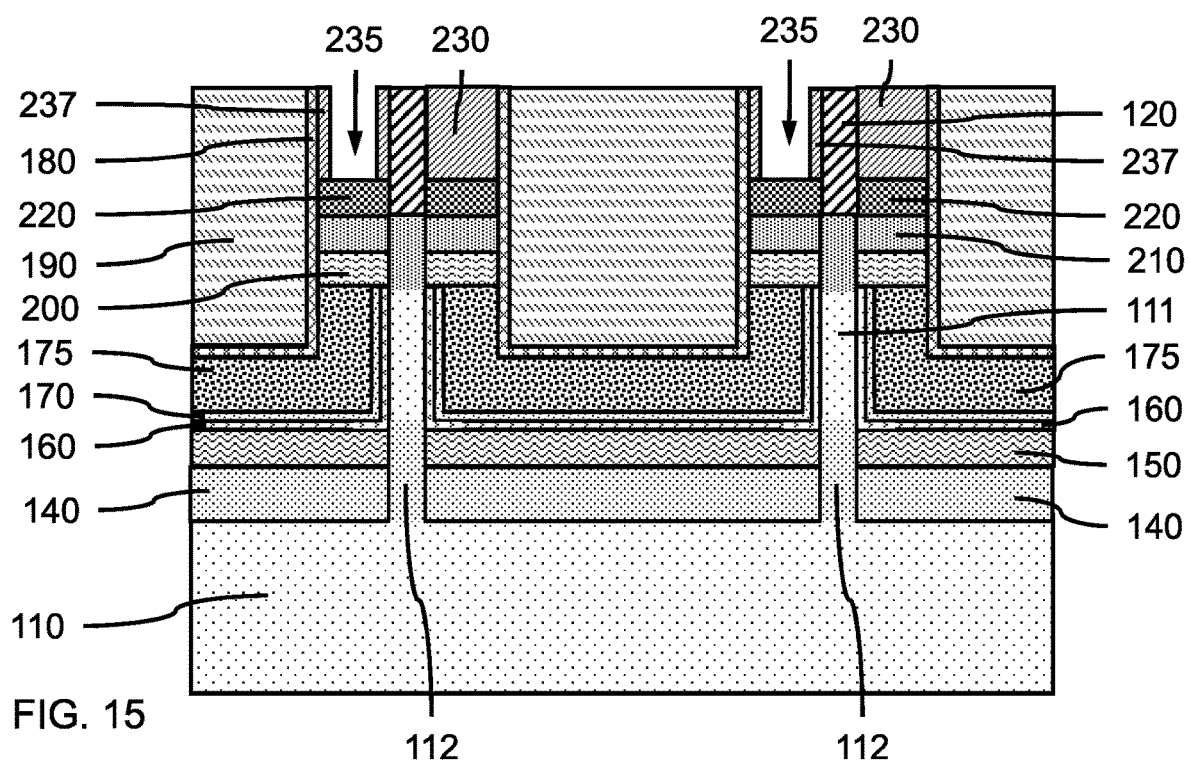
FIG. 15 is a cross-sectional side view showing a portion of each of the top plug layers removed to form openings that expose a portion of each of the bottom electrode layers, in accordance with an embodiment of the present invention.

FIG. 15 is a cross-sectional side view showing a portion of each of the top plug layers removed to form openings that expose a portion of each of the bottom electrode layers, in accordance with an embodiment of the present invention.

In one or more embodiments, a lithography mask can be deposited and patterned over the top plug layer 230, fin template(s) 120, encapsulation layer 180, and fill layer 190, to form opening(s) over predetermined sections of the top plug layer 230. In various embodiments, a portion of the top plug layer 230 exposed through an opening in the lithography mask can be removed using a selective, directional etch (e.g., RIE) to form access channels 235. An access channel 235 can be formed in the top plug layer 230 on opposite sides of the fin template 120, where the openings can be staggered and narrower than the top plug layer(s) 230. Portions of the top plug layer 230 can remain to form channel sidewalls 237 on a portion of encapsulation layer 180. The access channels 235 can expose an underlying portion of the bottom electrode layer 220.

In various embodiments, the channel sidewalls 237 can have a thickness in a range of about 2 nm to about 4 nm, and the access channels 235 can have a width in the range of about 8 nm to about 16 nm, or about 10 nm to about 12 nm, although other widths are contemplated.

Figure 16:
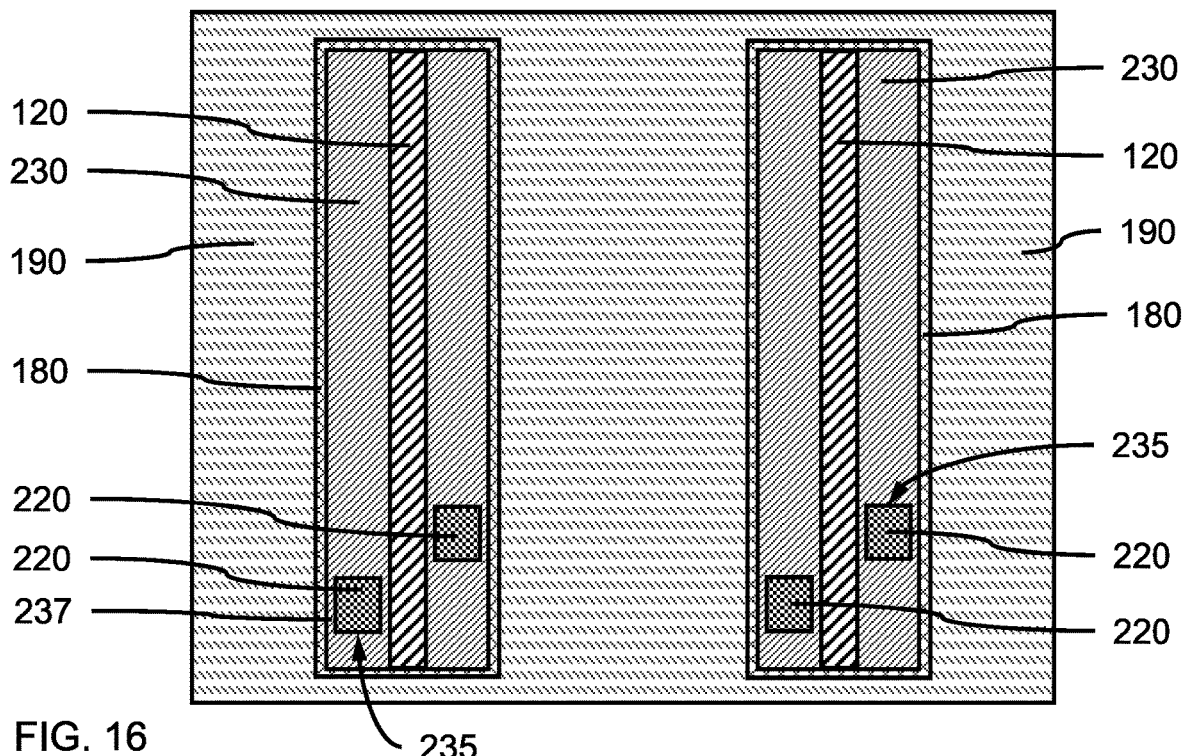
FIG. 16 is a top view of FIG. 15 showing the access channels formed in each of the top plug layers that expose a portion of each of the bottom electrode layers, in accordance with an embodiment of the present invention.

FIG. 16 is a top view of FIG. 15 showing the access channels formed in each of the top plug layers that expose a portion of each of the bottom electrode layers, in accordance with an embodiment of the present invention.

In one or more embodiments, the access channels 235 can be formed in the top plug layer 230, such that the access channels 235 formed on opposite sides of the fin template 120 are diagonally off-set from each other. The staggered portioning of the access channels 235 can provide for spacing of the metal lines and vias that subsequently form the electrical connection of the crossbar arrays. The staggered access channels 235 can allow the formation of two asymmetrically placed resistive memory elements electrically coupled to the same vertical transport fin field effect transistor. The two asymmetrically placed resistive memory elements can be coupled to different metal lines forming the crossbar arrays.

Figure 17:
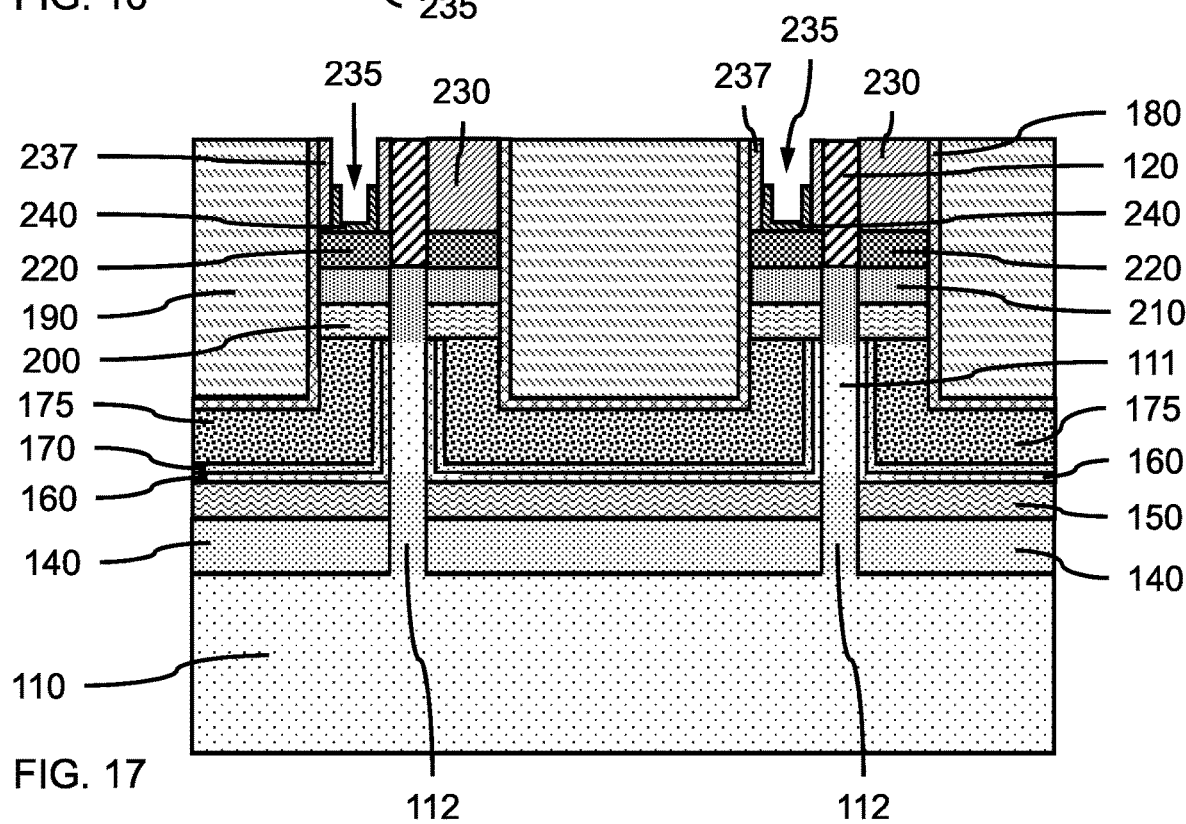
FIG. 17 is a cross-sectional side view showing a middle resistive layer formed in each of the access channels on the bottom electrode layers, in accordance with an embodiment of the present invention.

FIG. 17 is a cross-sectional side view showing a middle resistive layer formed in each of the access channels on the bottom electrode layers, in accordance with an embodiment of the present invention.

In one or more embodiments, a middle resistive layer 240 can be formed on the bottom electrode layers 220 in each of the access channels 235. The middle resistive layer 240 can be formed by a conformal deposition (e.g., ALD, PEALD) that can deposit a thin layer of material on the bottom electrode layers 220 and sidewalls of the access channels 235 without filling in the access channels 235. In various embodiments, the middle resistive layer 240 can have a thickness in a range of about 3 nm to about 10 nm, or about 5 nm to about 7 nm, although other thicknesses are also contemplated. While not intending to be bound by theory, it is believed that a thickness of about 3 nm or greater to about 10 nm allows oxygen vacancies to percolate through the thickness of the middle resistive layer 240 that can form a conductive metallic filament from the bottom electrode layer 220 to a top electrode layer. A thicker middle resistive layer 240 can hinder the percolation of the oxygen vacancies and formation of the conductive metal filament. The thickness of the bottom electrode layers 220 can be sufficient to prevent the middle resistive layer 240 from coming into contact with the top source/drain 210.

In various embodiments, a portion of the middle resistive layer 240 on the sidewalls of the access channels 235 can be removed by forming a conformal layer of the middle resistive layer 240, filling in the central area with an organic planarization layer (OPL), recessing the OPL to expose a portion of the middle resistive layer 240 on the sidewalls of top plug layer 230, and removing the exposed portion of the middle resistive layer 240, for example, by an HCl based wet chemistry. The remaining OPL can be removed by ashing to leave a cup-shaped or U-shaped middle resistive layer in the access channels.

In various embodiments, the middle resistive layer 240 can be a transition metal oxide, including, but not limited to, hafnium oxide (HfO), zirconium oxide (ZrO), Tantalum oxide (TaO), copper oxide (CuO), tungsten oxide (WO), titanium oxide (TiO), nickel oxide (NiO), and combinations thereof.

Figure 18:
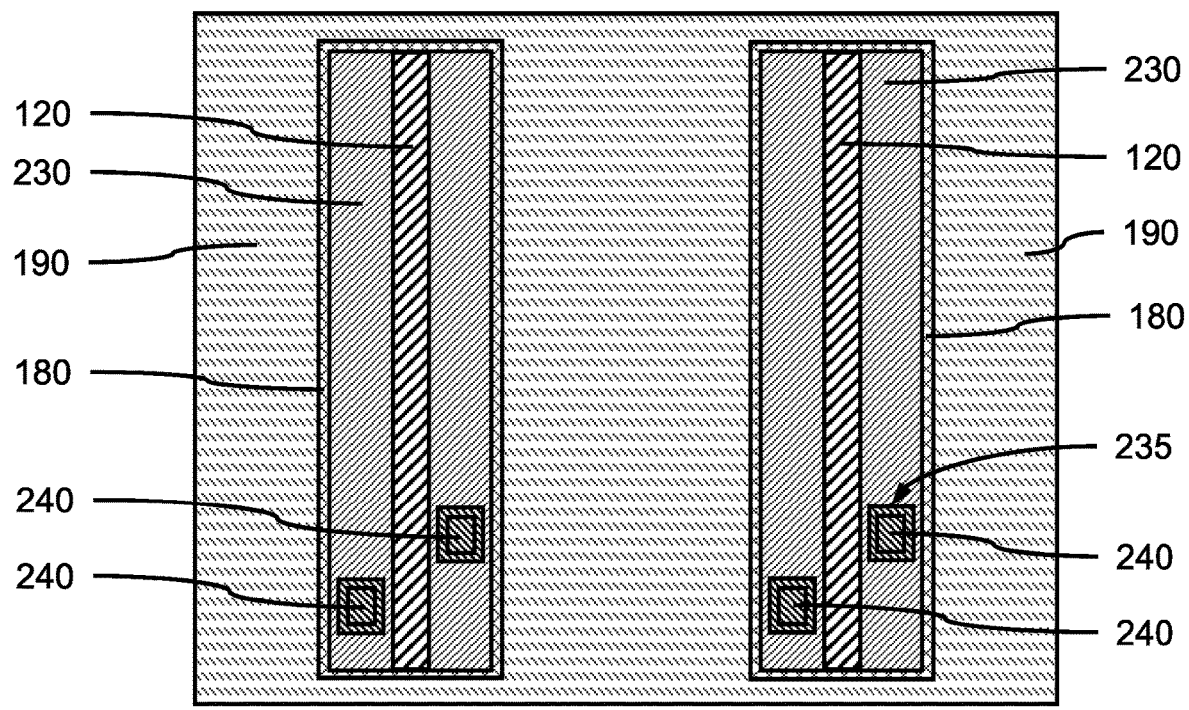
FIG. 18 is a top view of FIG. 17 showing the middle resistive layer formed in each of the access channels on the bottom electrode layers, in accordance with an embodiment of the present invention.

FIG. 18 is a top view of FIG. 17 showing the middle resistive layer formed in each of the access channels on the bottom electrode layers, in accordance with an embodiment of the present invention.

In one or more embodiments, the access channels 235 and middle resistive layer 240 can be diagonally off-set across the fin template 120.

Figure 19:
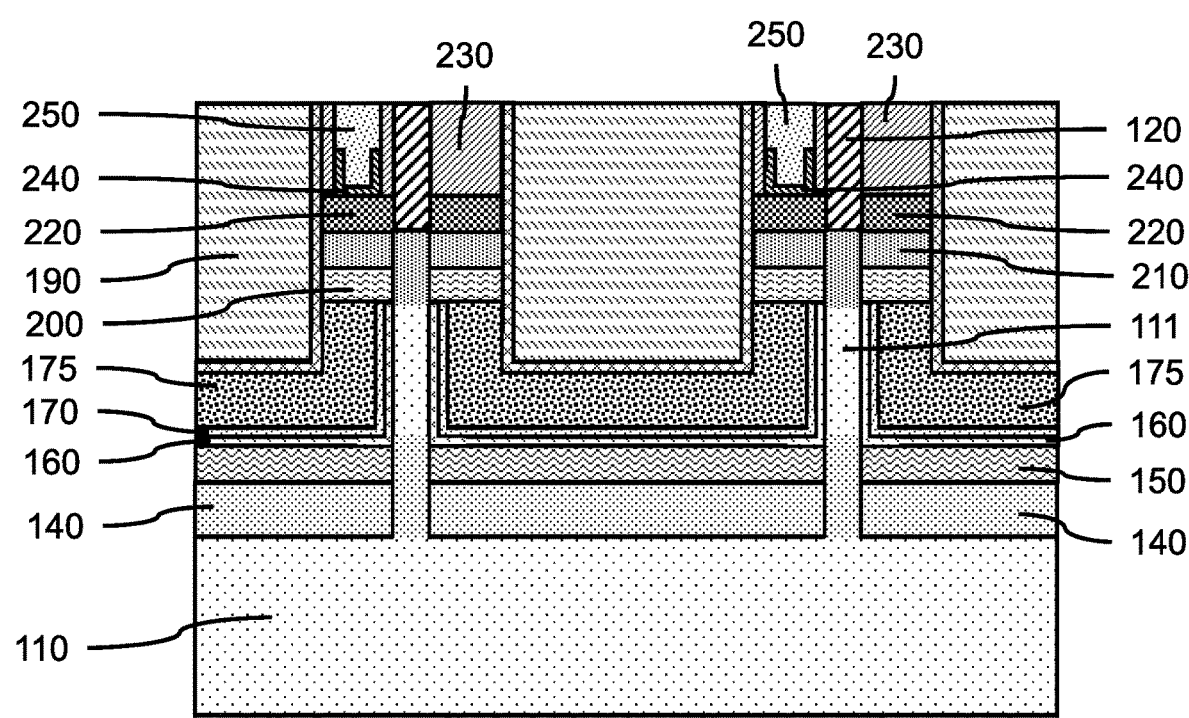
FIG. 19 is a cross-sectional side view showing a top electrode layer formed on the middle resistive layers in each of the access channels, in accordance with an embodiment of the present invention.

FIG. 19 is a cross-sectional side view showing a top electrode layer formed on the middle resistive layers in each of the access channels, in accordance with an embodiment of the present invention.

In one or more embodiment, a top electrode layer 250 can be formed on the middle resistive layer 240 in each of the access channels 235, where the top electrode layer 250 can be formed by a conformal deposition to avoid pinch-off between the middle resistive layer 240 on the sidewalls of the access channels 235 and the cup/U-shaped, middle resistive layer 240.

In various embodiments, the top electrode layer 250 can be titanium nitride (TiN), where the titanium nitride can be titanium rich, or titanium-aluminum carbide (TiAlC), that can form oxygen vacancies in the middle resistive layer 240. The top electrode layer 250 can be the same material as the bottom electrode layer 220. Each layer stack of a bottom electrode layer 220, middle resistive layer 240, and top electrode layer 250 can form a resistive memory element (i.e., ReRAM cell). Two ReRAM cells can be electrically coupled to each vertical transport fin field effect transistor (VT FinFET) to form a set of ReRAMs, where a first ReRAM can be on one side of the fin template 120 and a second ReRAM can be on the opposite side of the fin template 120.

Figure 20:
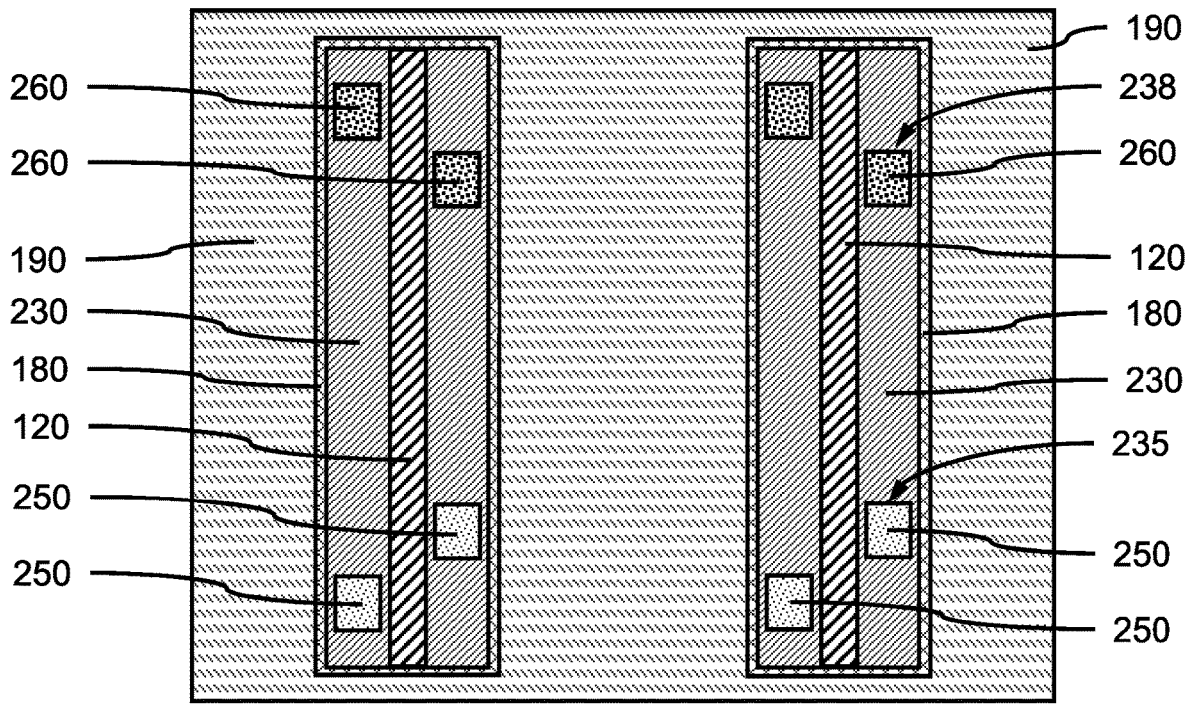
FIG. 20 is a top view showing electrical contacts formed in each of the sensing channels formed in the top plug layers, in accordance with an embodiment of the present invention.

FIG. 20 is a top view showing electrical contacts formed in each of the sensing channels formed in the top plug layers, in accordance with an embodiment of the present invention.

In one or more embodiments, a sensing channel 238 can be formed in the top plug layer 230 on opposite sides of each fin template 120, where the sensing channels 238 can be forming by lithographic masking and directional etching. The sensing channels 238 can be diagonally off-set across the fin template 120. In various embodiments, the sensing channels 238 can be filled with a conductive material, including, but not limited to, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, or any suitable combination of these materials to form electrical contacts 260 to the bottom electrode layer 220 of each resistive memory elements.

In various embodiments, a resistive memory structure can include a vertical transport fin field effect transistor, including a top source/drain 210, and two resistive memory elements electrically coupled to the top source/drain of the vertical transport fin field effect transistor, wherein each of the resistive memory elements includes the bottom electrode layer 220, a middle resistive layer 240, and a top electrode layer 250. An electrical contact 260 can be formed to each bottom electrode layer 220 of each of the two resistive memory elements.

Figure 21:
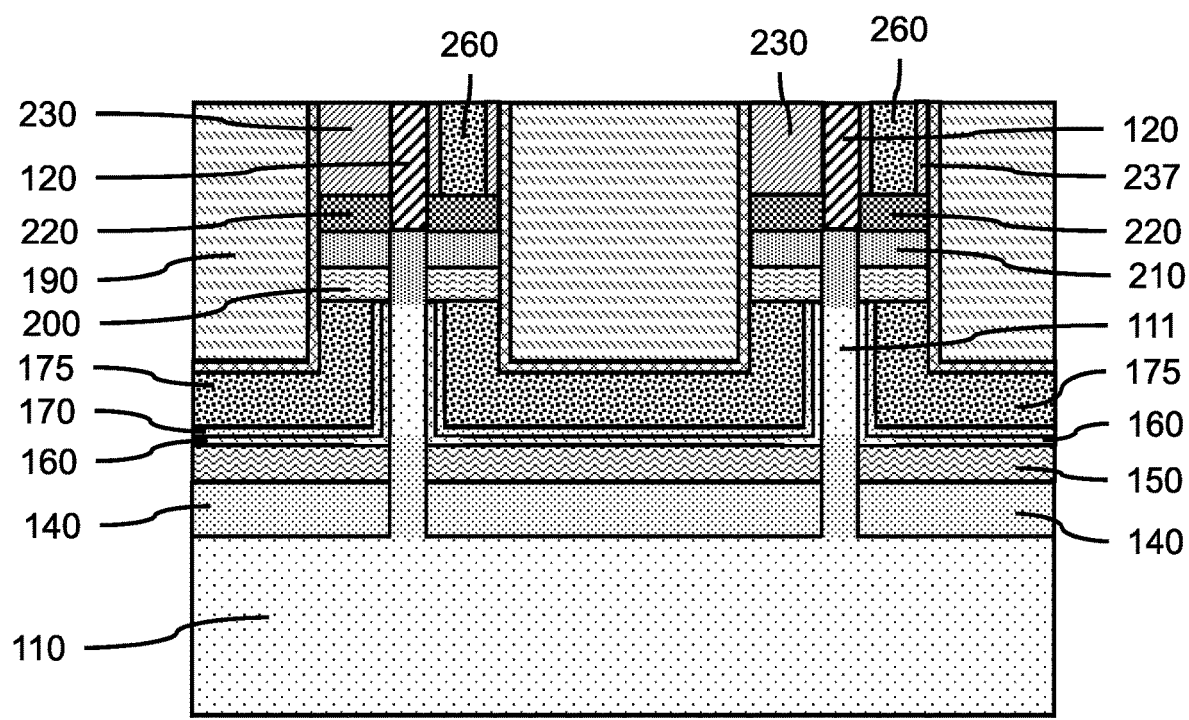
FIG. 21 is a cross-sectional side view showing the electrical contacts formed in the sensing channels formed in the top plug layers, in accordance with an embodiment of the present invention.

FIG. 21 is a cross-sectional side view showing the electrical contacts formed in the sensing channels formed in the top plug layers, in accordance with an embodiment of the present invention.

In one or more embodiments, the electrical contacts 260 can be in electrical contact with the bottom electrode layer 220 without intervening middle resistive layer 240 and top electrode layer 250. A first ReRAM can be used for weight update or training, and the second ReRAM can be used as a local reference. If a voltage is applied to the left ReRAM that changes the resistivity, the different in the resistivity change can be detected through comparison with the right ReRAM (local reference), which has not changed resistivity.

Figure 22:
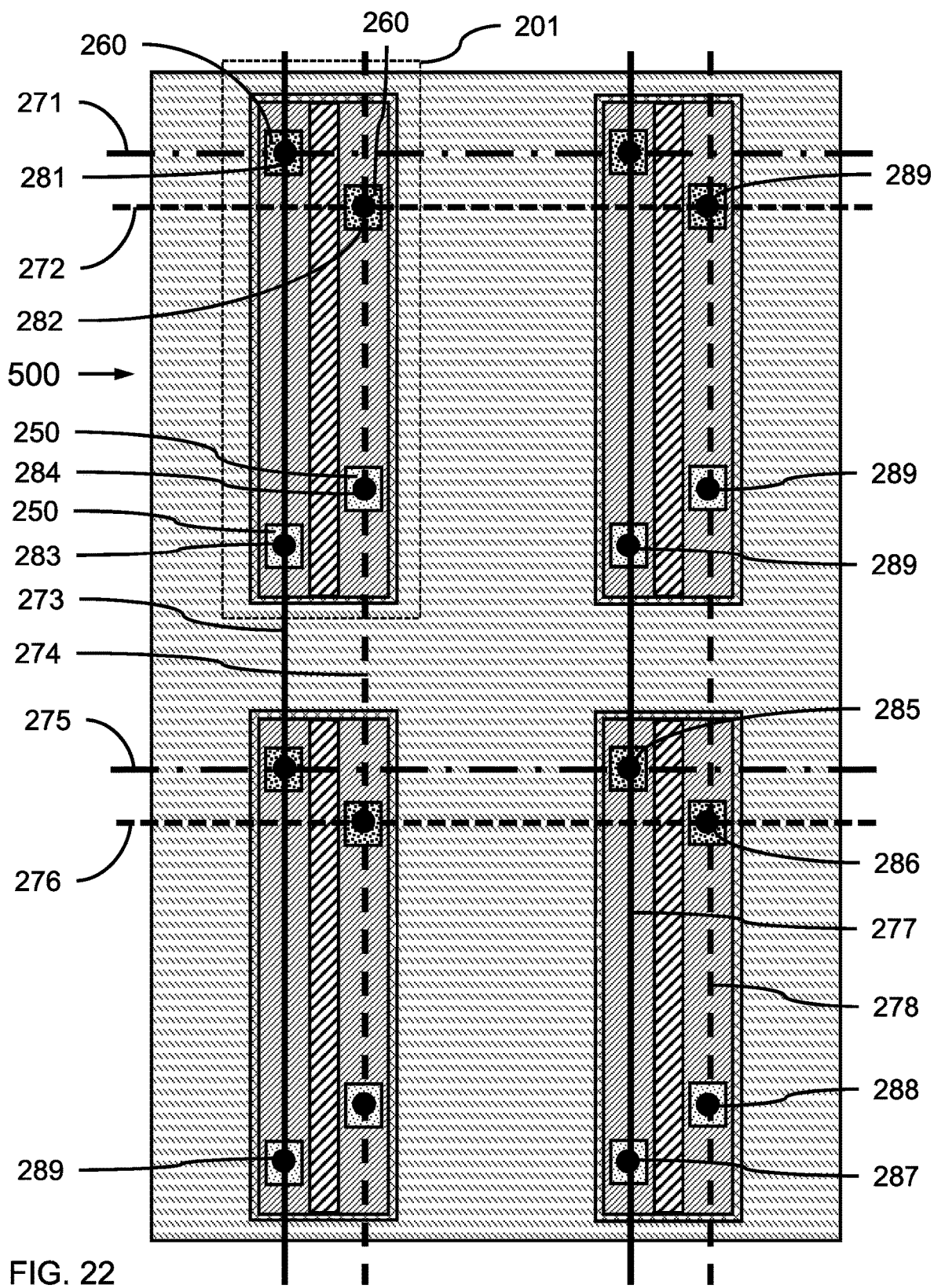
FIG. 22 is a top view showing a crossbar array connection for the vertical transport fin field effect transistor device having two ReRAM structures (1T2R), in accordance with an embodiment of the present invention.

FIG. 22 is a top view showing a crossbar array connection for the vertical transport fin field effect transistor device having two ReRAM structures (1T2R), in accordance with an embodiment of the present invention.

In one or more embodiments, metal lines 271, 272, 273, 274, 275, 276, 277, 278 and vias 281, 282, 283, 284, 285, 286, 287, 288, 289 can be formed in the overlying metallization layers to each of the resistive memory elements and each of the electrical contacts for sensing. Two crossbar arrays (solid, broken, and dashed lines) can be formed at the higher levels through via contacts to lower elements. In various embodiments, the crossbar array 500 can be a 1,000 resistive memory element X 1,000 resistive memory element array, a 3000 resistive memory element X 3000 resistive memory element array, or a 10,000 resistive memory element X 10,000 resistive memory element array, although other sizes are also contemplated depending on the application.

In various embodiments, a first metal line 271 can be electrically connected to the electrical contact 260 on a first resistive memory element of a first resistive memory structure 201 by a via 281, and a second metal line 272 can be electrically connected to the electrical contact 260 on the second resistive memory element of the first resistive memory structure 201 by another via 282. In various embodiments, a third metal line 273 can be electrically connected to the top electrode layer 250 of the first resistive memory element of a first resistive memory structure 201 by via 283, and a fourth metal line 274 can be electrically connected to the top electrode layer 250 of the second resistive memory element of the first resistive memory structure by another via 284, where metal lines 273, 274 do not connect to vias 281, 282 or electrical contacts 260. Similar metal lines 275, 276, 277, 278 can be formed and electrically connected to the resistive memory elements of other resistive memory structures by vias 285, 286, 287, 288, 289 for accessing the resistive memory elements and resistive memory structures. Metal lines 271, 273, 275, 277 can form an active array of resistive memory structures, whereas metal lines 272, 274, 276, 278 can form a reference array of resistive memory structures.

The weights in the active array (solid and broken lines) can be trained, and the weights in the reference array (dashed lines) can stay constant as local references. A physical change in the middle resistive layer can be used to update the weight of the resistive memory element, where a resistance change can be detected through lines 283 and 271 compared to lines 272 and 274. The current difference between solid and broken lines are sensed column by column and row by row for forward and backward paths. The VT FinFETs can be used for electroforming of pairs of two ReRAMs. In various embodiments, a VT FinFET is directly electrically connected to two ReRAMs, to form a pass gate to control current flow through each of the ReRAMs. A single VT FinFET can control current flow through the two parallel resistive memory elements. The VT FinFETs and ReRAMs are self-aligned through the alignment with the top source/drains and intervening fin template.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Spatially relative such as "beneath" "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A resistive memory structure, comprising:
   a vertical fin on a substrate, wherein the sidewalls of the vertical fin each have a {100} crystal face;
   a fin template on the vertical fin;
   a gate structure on the vertical fin;
   a top source/drain on opposite sidewalls of the vertical fin;
   a bottom electrode layer on the top source/drain, wherein the bottom electrode layer is on opposite sides of the fin template;
   a first middle resistive layer on a portion of the bottom electrode layer;
   a top electrode layer on the first middle resistive layer; and
   a first electrical contact on a portion of the bottom electrode layer.

2. The resistive memory structure of claim 1, further comprising a bottom source/drain layer on the substrate and adjoining the vertical fin.

3. The resistive memory structure of claim 2, further comprising a second middle resistive layer on a portion of the bottom electrode layer on a side opposite the fin template from the first middle resistive layer.

4. The resistive memory structure of claim 3, further comprising a second electrical contact on a portion of the bottom electrode layer on the side opposite the fin template from the first electrical contact.

5. The resistive memory structure of claim 1, wherein the bottom electrode layer is selected from the group of conductive materials consisting of tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), tantalum nitride (TaN), titanium nitride (TiN), tantalum carbide (TaC), titanium carbide (TiC), titanium aluminum carbide (TiAlC), tantalum magnesium carbide (TaMgC), tungsten silicide (WSi), tungsten nitride (WN), ruthenium oxide (RuO$_2$), cobalt silicide (CoSi), nickel silicide (NiSi)), titanium aluminide (TiAl), zirconium aluminide (ZrAl), and suitable combination thereof.

6. The resistive memory structure of claim 5, wherein the middle resistive layer is hafnium oxide (HfO).

7. The resistive memory structure of claim 6, wherein the top electrode layer is titanium rich titanium nitride (TiN) or titanium-aluminum carbide (TiAlC).

8. The resistive memory structure of claim 7, wherein the gate structure includes a gate dielectric layer on a central portion of the vertical fin and a gate electrode on the gate dielectric layer.

9. The resistive memory structure of claim 8, further comprising a bottom spacer layer between a portion of the gate dielectric layer and a bottom source/drain layer on the substrate and adjoining the vertical fin.

10. A crossbar array, comprising:
    a plurality of resistive memory structures each including a vertical transport fin field effect transistor, two resistive memory elements electrically coupled to a top source/drain of the vertical transport fin field effect transistor, and two electrical contacts formed to a bottom electrode layer of each of the two resistive memory elements;
    a first metal line electrically connected to a first of the two electrical contacts on each of the plurality of resistive memory structures in a row of the crossbar array; and
    a second metal line electrically connected to a first of the two resistive memory elements on each of the plurality of resistive memory structures in a column of the crossbar array.

11. The crossbar array of claim 10, wherein each of the resistive memory elements includes the bottom electrode layer, a middle resistive layer, and a top electrode layer.

12. The crossbar array of claim 11, wherein the bottom electrode layer, middle resistive layer, and top electrode layer of each of the two resistive memory elements are on opposite sides of a fin template on the vertical transport fin field effect transistor.

13. The crossbar array of claim 12, further comprising a third metal line electrically connected to a first of the two electrical contacts on each of the plurality of resistive memory structures in a row of the crossbar array, and a fourth metal line electrically connected a second of the two resistive memory elements on each of the plurality of resistive memory structures in a column of the crossbar array.

14. A method of forming a resistive memory structure, comprising:
    forming a vertical fin on a substrate and a fin template on the vertical fin, wherein the sidewalls of the vertical fin each have a {100} crystal face;
    forming a gate structure on the vertical fin;
    forming a top source/drain on opposite sidewalls of the vertical fin;
    forming a bottom electrode layer on the top source/drain, wherein the bottom electrode layer is on opposite sides of the fin template;
    forming a first middle resistive layer on a portion of the bottom electrode layer;
    forming a top electrode layer on the first middle resistive layer; and
    forming a first electrical contact on a portion of the bottom electrode layer.

15. The method of claim 14, further comprising forming a bottom source/drain layer on the substrate and adjoining the vertical fin.

16. The method of claim 15, further comprising forming a second middle resistive layer on a portion of the bottom electrode layer on a side opposite the fin template from the first middle resistive layer.

17. The method of claim 16, further comprising forming a second electrical contact on a portion of the bottom electrode layer on the side opposite the fin template from the first electrical contact.

18. The method of claim 17, wherein the bottom electrode layer is nitrogen rich titanium nitride (TiN) or titanium-aluminum carbide (TiAlC).

19. The method of claim 18, wherein the middle resistive layer is hafnium oxide (HfO).

20. The method of claim 19, wherein the top electrode layer is titanium rich titanium nitride (TiN) or titanium-aluminum carbide (TiAlC).

* * * * *